United States Patent
Lee et al.

(10) Patent No.: US 10,304,680 B1
(45) Date of Patent: May 28, 2019

(54) FABRICATING SEMICONDUCTOR DEVICES HAVING PATTERNS WITH DIFFERENT FEATURE SIZES

(71) Applicant: Macronix International Co., Ltd., Hsinchu (TW)

(72) Inventors: Chih-Hsiung Lee, Hsinchu (TW); Tzung-Ting Han, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/851,839

(22) Filed: Dec. 22, 2017

(51) Int. Cl.
| | | |
|---|---|---|
| H01L 21/033 | (2006.01) |
| H01L 27/11524 | (2017.01) |
| H01L 27/11529 | (2017.01) |
| H01L 27/11531 | (2017.01) |
| H01L 29/788 | (2006.01) |
| H01L 21/762 | (2006.01) |
| H01L 29/06 | (2006.01) |
| H01L 21/027 | (2006.01) |

(Continued)

(52) U.S. Cl.
CPC ...... *H01L 21/0338* (2013.01); *H01L 21/0273* (2013.01); *H01L 21/0335* (2013.01); *H01L 21/0337* (2013.01); *H01L 21/28273* (2013.01); *H01L 21/76224* (2013.01); *H01L 27/11524* (2013.01); *H01L 27/11529* (2013.01); *H01L 27/11531* (2013.01); *H01L 29/0649* (2013.01); *H01L 29/66825* (2013.01); *H01L 29/7883* (2013.01)

(58) Field of Classification Search
CPC ............. H01L 21/0338; H01L 21/0273; H01L 21/0335; H01L 21/0337; H01L 21/28273; H01L 21/76224; H01L 27/11524; H01L 27/11529; H01L 27/11531; H01L 29/0649; H01L 29/66825; H01L 29/7883; H01L 23/522; H01L 21/768; H01L 21/28
See application file for complete search history.

(56) References Cited

U.S. PATENT DOCUMENTS

| | | |
|---|---|---|
| 7,419,909 B2 | 9/2008 | Kim et al. |
| 8,293,656 B2 | 10/2012 | Kim et al. |

(Continued)

FOREIGN PATENT DOCUMENTS

| | | |
|---|---|---|
| TW | 201227871 | 7/2012 |
| TW | 201643939 | 12/2016 |

*Primary Examiner* — Shahed Ahmed
(74) *Attorney, Agent, or Firm* — Fish & Richardson P.C.

(57) ABSTRACT

Methods of fabricating semiconductor devices having patterns with different feature sizes are provided. An example method includes: etching a first film layer below a patterned mask to form first and second features on a second film layer, forming respective first and second spacers adjacent to sidewalls of the first and second features on the second film layer, removing the first and second features to expose respective first and second portion of the second film layer, the second portion having a larger CD than the first portion, controlling an etching process such that the first portion is etched through and the second portion is protected from etching by a protective film formed during the etching process, and patterning a thin film masked by the first spacer, the second spacer, and the second portion to form smaller features and larger features in respective first and second regions of the thin film.

18 Claims, 21 Drawing Sheets

(51) Int. Cl.
*H01L 21/28* (2006.01)
*H01L 29/66* (2006.01)

(56) References Cited

U.S. PATENT DOCUMENTS

| | | | | |
|---|---|---|---|---|
| 8,389,383 | B1 * | 3/2013 | Hopkins | H01L 29/02 |
| | | | | 257/797 |
| 9,214,360 | B2 * | 12/2015 | Jang | H01L 21/28141 |
| 9,312,328 | B2 | 4/2016 | He | |
| 9,324,722 | B1 * | 4/2016 | Woo | H01L 21/76829 |
| 9,633,851 | B2 | 4/2017 | He | |
| 2001/0018253 | A1 | 8/2001 | Nakamura et al. | |
| 2006/0094203 | A1 | 5/2006 | Choi et al. | |
| 2006/0124988 | A1 | 6/2006 | Hur et al. | |
| 2008/0277665 | A1 | 11/2008 | Dong et al. | |
| 2009/0035584 | A1 * | 2/2009 | Tran | H01L 21/0337 |
| | | | | 428/446 |
| 2010/0155959 | A1 * | 6/2010 | Park | H01L 21/0337 |
| | | | | 257/773 |
| 2010/0297850 | A1 * | 11/2010 | Kim | H01L 21/0337 |
| | | | | 438/717 |
| 2012/0208361 | A1 * | 8/2012 | Ha | H01L 21/0337 |
| | | | | 438/597 |
| 2013/0228842 | A1 | 9/2013 | Kotou et al. | |
| 2017/0117177 | A1 | 4/2017 | Briggs et al. | |
| 2017/0345679 | A1 * | 11/2017 | Kwon | H01L 21/3086 |
| 2018/0308695 | A1 * | 10/2018 | LaVoie | H01L 21/0338 |

\* cited by examiner

US 10,304,680 B1

FABRICATING SEMICONDUCTOR DEVICES HAVING PATTERNS WITH DIFFERENT FEATURE SIZES

BACKGROUND

Self-Aligned Double Patterning (SADP) can be adopted to form small pitch patterns, e.g., memory cells with a small pitch. The SADP technique may form repeating small-pitch patterns and spaces on a semiconductor substrate. However, if large-pitch patterns also need to be formed on other areas of the semiconductor substrate, the small-pitch patterns and the large-pitch patterns may need to be formed separately, which causes complicated fabrication processes.

SUMMARY

The present disclosure describes methods of fabricating semiconductor devices or systems having patterns with different feature sizes, and the semiconductor devices or systems fabricated by such methods.

One aspect of the present disclosure features a method of patterning a thin film, including: etching a first film layer disposed below a patterned mask to form a first feature and a second feature on a second film layer disposed below the first film layer, the second feature having a larger critical dimension (CD) than the first feature; forming a first spacer adjacent to sidewalls of the first feature and a second spacer adjacent to sidewalls of the second feature on the second film layer; removing the first feature to expose a first portion of the second film layer and removing the second feature to expose a second portion of the second film layer, the second portion having a larger CD than the first portion; controlling an etching process such that the first portion of the second film layer is etched through and the second portion of the second film layer is protected from etching by a protective film formed during the etching process; and patterning a first region of the thin film masked by the first spacer to form a smaller feature in the first region and patterning a second region of the thin film masked by the second portion and the second spacer to form a larger feature in the second region.

The smaller feature can have a first width determined by a width of the first spacer, and the larger feature can have a second width determined by a width of the second feature and a width of the second spacer, the first width being smaller than the second width.

In some implementations, controlling the etching process includes: etching the second portion of the second film layer to obtain material of the second film layer with an amount enough to react with an etching gas of the etching process to form the protective film on a surface of the second portion of the second film. In some cases, controlling the etching process includes: controlling a flow rate of the etching gas. The material of the second film layer can include silicon nitride (SiN). The material of the first film layer can include advanced patterning film (APF).

In some implementations, forming the first spacer and the second spacer includes: conformally depositing a spacer layer over the first feature and the second feature and on the second film layer; and etching the spacer layer to expose the first feature to form the first spacer and the second feature to form the second spacer. A width of the first spacer corresponds to a thickness of the deposited spacer layer.

The method can further include: etching the second film layer masked by the first spacer, the first feature, the second spacer, and the second feature. The method can also include: lithographically patterning a photo resist (PR) layer disposed over the first film layer to form the patterned mask, the patterned mask including respective PR features corresponding to the first feature and the second feature.

Another aspect of the present disclosure features a method of fabricating a semiconductor device, including: depositing a template hard mask over a first region and a second region of a target material layer on a semiconductor substrate; lithographically patterning a photo resist (PR) layer disposed over the template hard mask to form a patterned mask on the template hard mask; etching a first film layer of the template hard mask with the patterned mask to form a first feature and a second feature in at least a portion of the first film layer, the second feature having a width larger than the first feature; conformally depositing a spacer layer over the first feature and the second feature and on a second film layer of the template hard mask, the second film layer disposed below the first film layer; etching the spacer layer to expose the first feature to form first sidewall spacers adjacent to first sidewalls of the first feature and the second feature to form second sidewall spacers adjacent to second sidewalls of the second feature; removing the first feature to expose a first portion of the second film layer and the second feature to expose a second portion of the second film layer, the second portion having a larger surface area than the first portion; controlling an etching process such that the first portion of the second film layer is etched through and the second portion of the second film layer is protected from etching by a protective film formed during the etching process; and etching the first region of the target material layer masked by the first sidewall spacers to form a smaller feature in the first region and the second region of the target material layer masked by the second portion of the second film layer and the second sidewall spacers to form a larger feature in the second region.

Controlling the etching process can include: etching the second portion of the second film layer to obtain material of the second film layer with an amount enough to react with an etching gas of the etching process to form the protective film on a surface of the second portion of the second film. Depositing the template hard mask can include: sequentially depositing an oxide layer, an amorphous silicon layer, a silicon nitride layer as the second film layer, and an advanced patterning film (APF) as the first film layer on the target material layer.

The method can further include forming an integrated memory circuit on the semiconductor substrate, the integrated memory circuit including a memory cell region. The first region and the second region can be in the memory cell region, the smaller feature defining a smaller cell line width and the larger feature defining a larger cell line width.

In some cases, the target material layer includes a floating gate layer, and etching the first and second regions of the target material layer can include etching through the floating gate layer into the semiconductor substrate to form first discrete floating gates with the smaller cell line width in the first region and second discrete floating gates with the larger cell line width in the second region. The smaller cell line width can be determined by a width of the first sidewall spacers, and the larger cell line width can be determined by a width of the second feature and a width of the second sidewall spacers. The width of the first sidewall spacers can correspond to a thickness of the deposited spacer layer, and the width of the second sidewall spacers can be substantially identical to the width of the first sidewall spacers.

In some implementations, the patterned mask includes first and second PR features corresponding to the first feature and the second feature in the first thin film layer and a third PR feature, the third PR feature being over a third region of the target material layer, the third region being in a periphery region of the integrated memory circuit. The third PR feature can be transferred into the first film layer to form a third feature on a third portion of the second film layer, the third portion having a larger surface area than the first portion. The third portion can be protected from etching by a second protective film formed during the etching process.

In some cases, the method can further include: etching the third region of the target material layer masked by the third portion of the second film layer and third sidewall spacers formed adjacent to the third feature to form a third larger feature in the third region, the third larger feature defining a third width larger than the larger cell line width. The method can further include: forming an isolation layer on the floating gates and in trenches therebetween; selectively forming a second photo resist layer on the third region of the conductive layer; etching the isolation layer on the first and second regions to form recesses between adjacent floating gates, the isolation layer on the third region being protected from etching with the second photo resist layer; removing the second photo resist layer from the third region; forming an inter-gate dielectric layer on the first, second, and third regions; and forming a control gate layer on the inter-gate dielectric layer. The method can also further include: forming a third photo resist layer on the first, second, and third regions; selectively etching through the third photo resist layer, the control gate layer and the inter-gate dielectric layer to floating gates on the third region to form respective openings; removing the third photo resist layer; and forming a conductive layer on the third region to fill in the respective openings such that the conductive layer and the floating gates on the third region are conductively connected.

In some implementations, the method further includes fabricating an integrated memory circuit on the semiconductor substrate, the integrated memory circuit including a memory cell region and a periphery region. The first region can be in the memory cell region, the smaller feature defining a smaller cell line width, and the second region can be in the periphery region, the larger feature defining a width larger than the smaller cell line width.

A further aspect of the present disclosure features a semiconductor memory device including: a semiconductor substrate defining a first cell region and a second cell region; a first array of first memory cells formed on the first cell region, each of the first memory cells having a first cell pitch; and a second array of second memory cells formed on the second cell region, each of the second memory cells having a second cell pitch with a critical dimension (CD) larger than the first cell pitch. The semiconductor memory device can further include: a third transistor formed on a periphery region of the semiconductor substrate, the third transistor having a CD larger than the second cell pitch.

The details of one or more disclosed implementations are set forth in the accompanying drawings and the description below. Other features, aspects, and advantages will become apparent from the description, the drawings and the claims.

DETAILED DESCRIPTION

Implementations of the present disclosure provide a method of fabricating a semiconductor device, e.g., a non-volatile memory device, having patterns with different feature sizes, e.g., memory cells with different cell line widths or pitches. The method can form different memory cell sizes on the same memory chip by a modified self-aligned double patterning (SADP) process. In such a process, etch loading effect is created to produce a larger feature on a hard mask (HM) layer while etching the HM layer with a sidewall spacer as a mask to produce a smaller feature on the same hard mask (HM). The HM layer can be made of silicon nitride (SiN) or oxide or any film with heavy polymer behavior that can create such etch loading effect during the etching.

The method can form a first cell region of a memory chip with a smaller cell pitch to provide high density storage with low cost and a second cell region of the memory chip with a larger cell pitch to provide high reliability storage for secure/important data to avoid reliability degrading issues, e.g., cycle duration and data retention. An area ratio of smaller and larger pitches can be arbitrary and can be determined based on a user's demand. The formed memory chip can fulfill high-density storage demand and high-reliability storage demand at the same time.

This technology enables the fabrication of a memory chip composed of two different pitch cells for different applications without additional photo/mask process. It can be also applicable to fabrication of any array composed of patterns with different feature sizes. For example, it is applicable to the fabrication of memory cells with a smaller feature size on a cell region and transistors with a larger feature size on a periphery region. It can also be applicable to any suitable multiple patterning process, e.g., self-aligned double patterning (SADP), self-aligned triple patterning (SATP), or self-aligned quadruple patterning (SAQP).

The techniques can be applicable to various memory types, such as SLC (single-level cell) devices, MLC (multi-level cell) devices like 2-level cell devices, TLC (triple-level cell) devices, QLC (quad-level cell) devices, or any suitable combination thereof. For example, memory cells with a smaller cell pitch are programmable to be MLC cells, TLC cells, or QLC cells for higher density storage, and memory cells with a larger cell pitch are programmable to be SLC cells for higher reliability. This technology is also applicable to fabrication of any suitable non-volatile memory system, e.g., NAND flash memory, NOR flash memory, AND flash memory, phase-change memory (PCM), or others, or any other semiconductor devices or systems, e.g., logic devices. For illustration purpose only, the following description is directed to fabricating non-volatile memory devices having memory cells with different cell line widths and/or pitches.

Figure 1A:
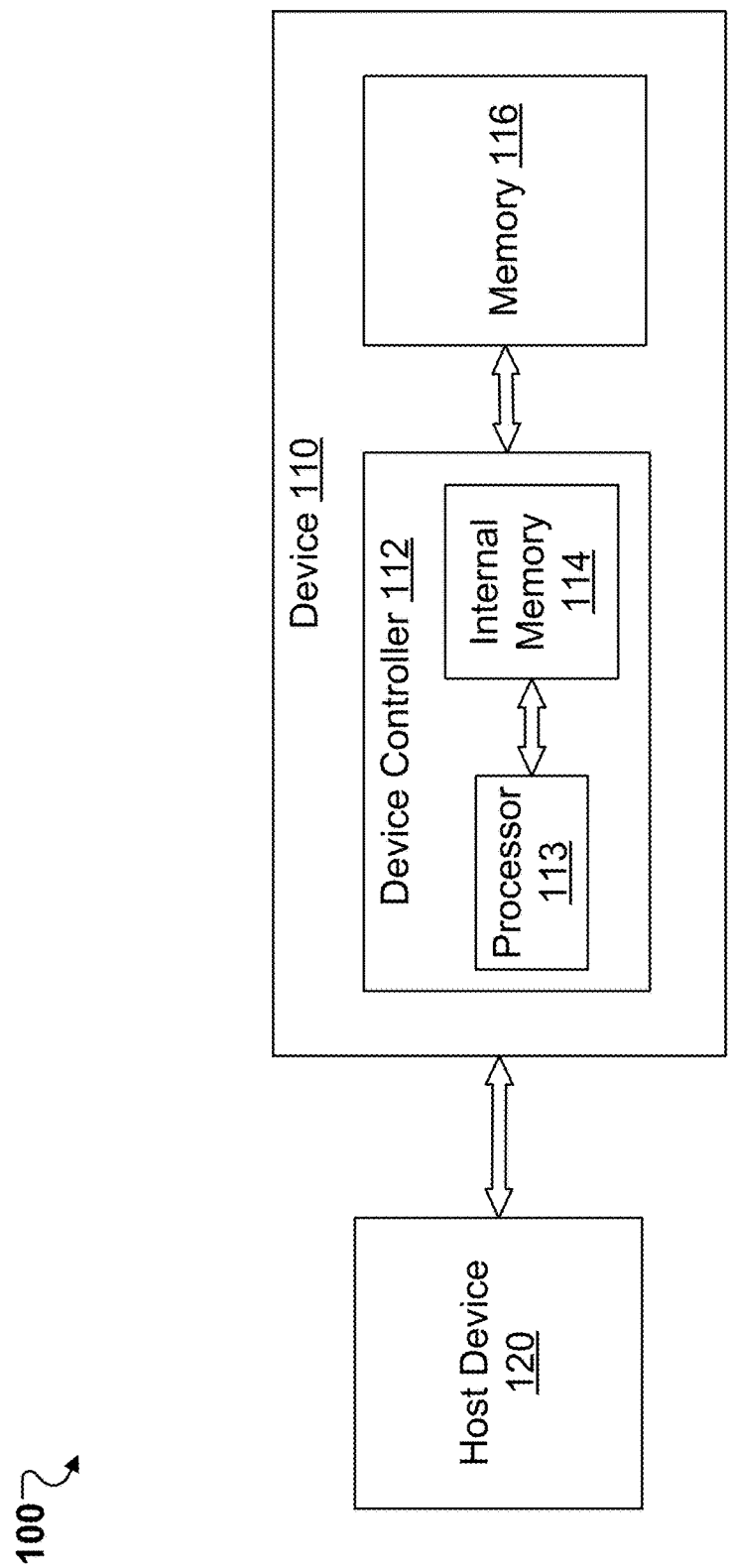
FIG. 1A illustrates an example of a system including a memory, according to one or more implementations.

FIG. 1A illustrates an example of a system 100. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that requested by the processor 113 during runtime.

The device controller 112 transfers the instruction code and/or the data from the memory 116 to the internal memory 114. In some implementations, the memory 116 is a non-volatile memory configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

Figure 1B:
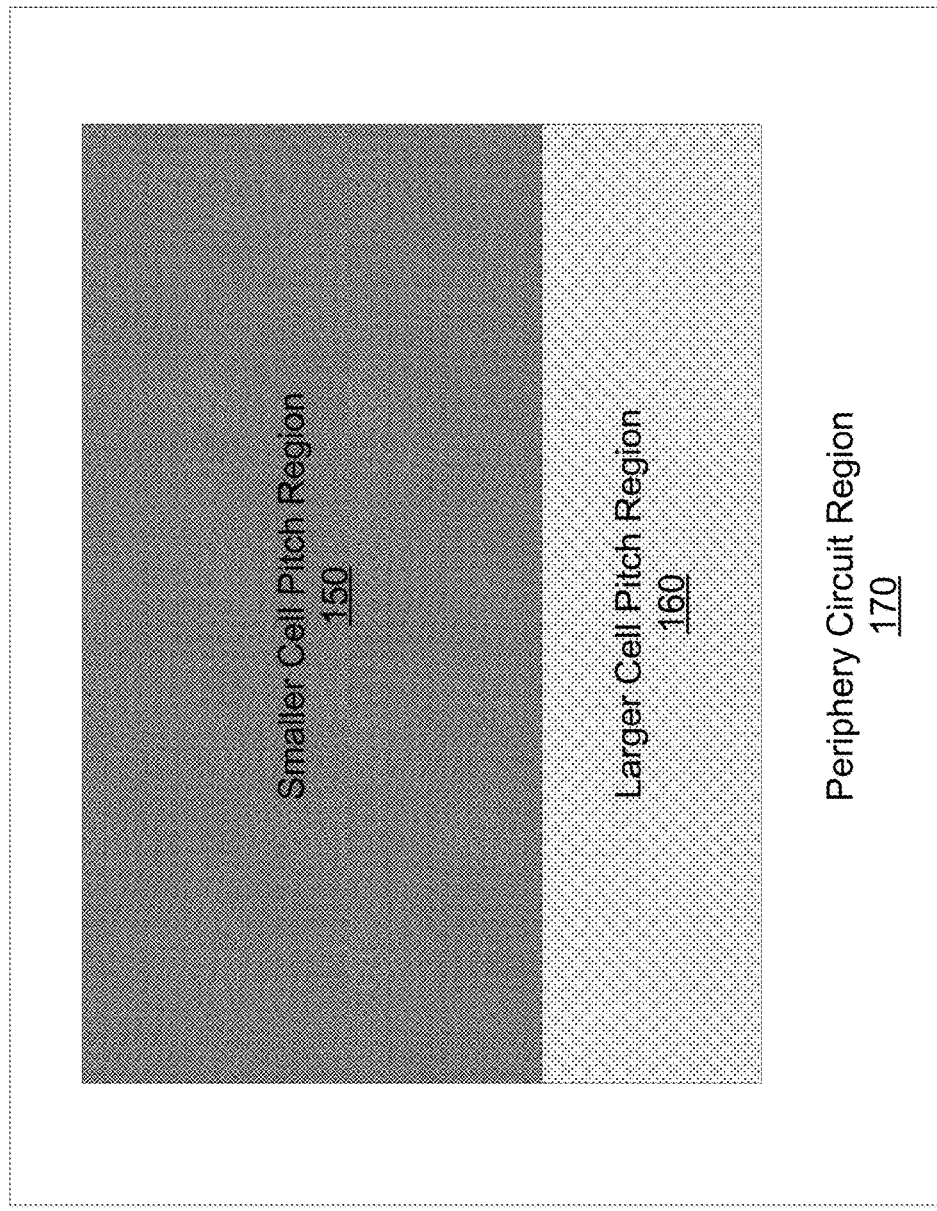
FIG. 1B illustrates an example memory configuration of the memory of FIG. 1A, according to one or more implementations.

FIG. 1B illustrates an example memory configuration of the memory 116 of FIG. 1A, according to one or more implementations. The memory 116 includes a smaller cell pitch region 150, a larger cell pitch region 160, and a periphery circuit region 170. An array of memory cells with a smaller cell pitch can be formed in the smaller cell pitch region 150. An array of memory cells with a larger cell pitch can be formed in the larger cell pitch region 160. The smaller cell pitch region 150 and the larger cell pitch region 160 can have any suitable areas, and associated area ratio. For example, an area ratio between the region 150 and the region 160 can be 90:10, 80:20, 50:50, 40:60, or any suitable ratio. The area ratio can depend, for example, on a user's demand. The smaller cell pitch and the larger cell pitch can also have any suitable sizes. For example, the smaller cell pitch can have a minimum cell pitch according to an SADP process. The larger cell pitch can have a suitable cell pitch, which can be achieved by a photolithograph patterning process. A ratio between the smaller cell pitch and the larger cell pitch can be any suitable value, for example, depending on a user's demand. For example, according to a high storage density demand, an area of the region 150, the smaller cell pitch, and/or a memory cell type (e.g., SLC, MLC, TLC, or QLC) can be determined together. According to a high reliability demand, an area of the region 160, the larger cell pitch, and/or a memory cell type (e.g., SLC or MLC) can be determined together.

The periphery circuit region 170 is electrically coupled to the smaller cell pitch region 150 and larger cell pitch region 160 and transmits control and/or data signals to the smaller cell pitch region 150 and the larger cell pitch region 160. Metal-oxide-semiconductor (MOS) transistors can be formed on the periphery circuit region 170. As discussed in further details in FIG. 1D and FIGS. 2A-2P, the smaller cell pitch region 150, the larger cell pitch region 160, and a periphery MOS region 180 in the periphery circuit region 170 can be formed together in an integrated memory chip.

Figure 1C:
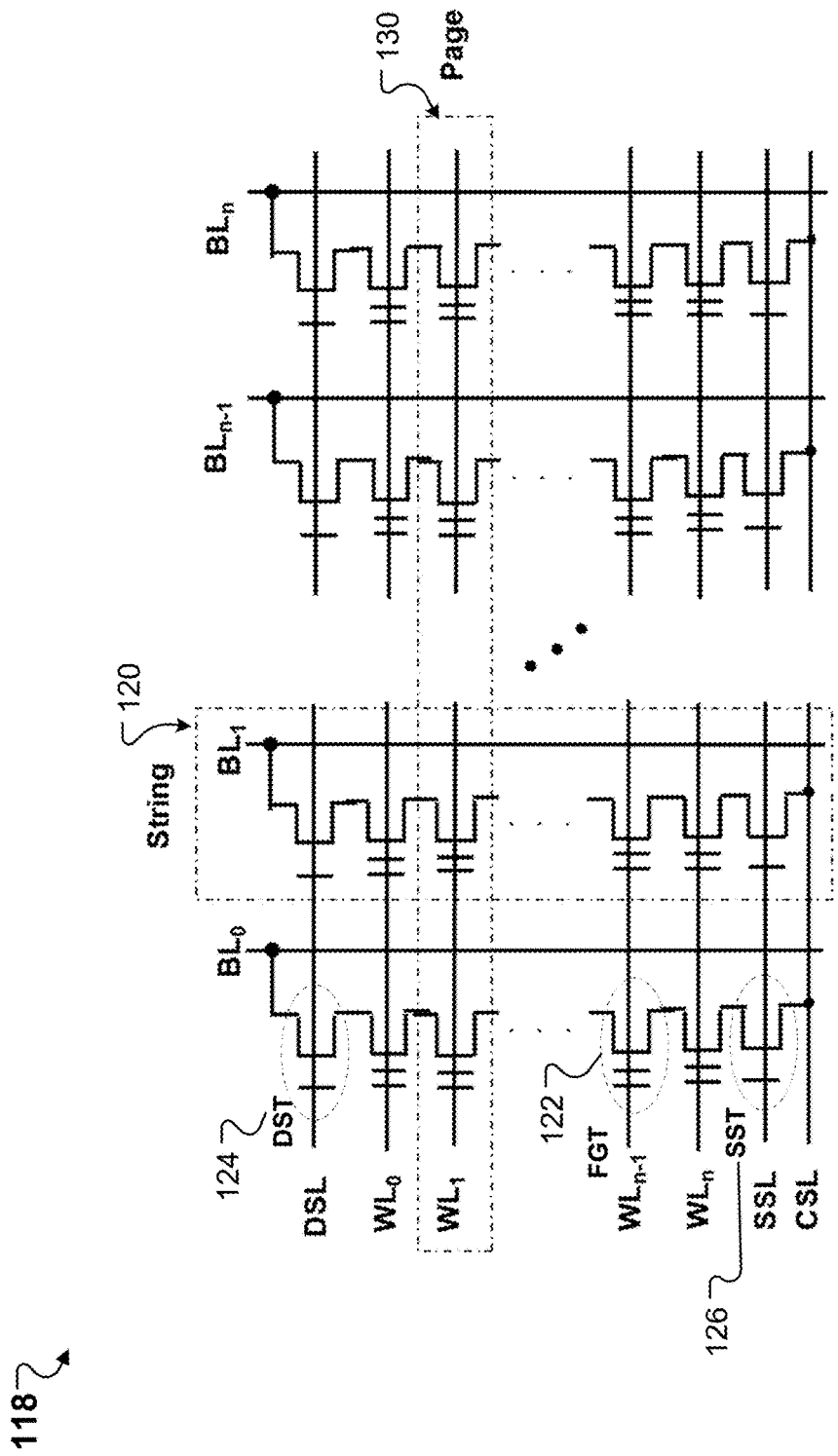
FIG. 1C illustrates an example memory block in the memory of FIG. 1A, according to one or more implementations.

FIG. 1C illustrates an example configuration of a block 118 of the memory 116. The block 118 includes a number of memory cells 122 that are coupled in series to column bit lines $BL_0$, $BL_1$, . . . , $BL_{n-1}$, and $BL_n$ to form a plurality of cell strings 120, and to row word lines $WL_0$, $WL_1$, . . . , $WL_{n-1}$, and $WL_n$ to form a plurality of cell pages 130.

In some implementations, a cell string 120 includes a drain select transistor (DST) 124, a plurality of memory cells 122, and a source select transistor (SST) 126, which are all connected in series. A drain of the DST 124 is connected to a bit line BL, and its source is connected to a drain of the memory cell 122. A gate of the DST 124 is connected to a drain select line (DSL). Gates of the DSTs in different strings are also connected to the same DSL. Gates of the memory cells 122 are respectively connected to word lines $WL_0$, $WL_1$, . . . , $WL_{n-1}$, $WL_n$. A drain of the SST 126 is connected to a source of the memory cells 122, and its drain is connected to a common source line (CSL). A gate of the SST 126 is connected to a source select line (SSL). Gates of the SSTs in different strings are also connected to the same SSL. The DST 124 and the SST 126 can be metal-oxide-semiconductor (MOS) transistors, and the memory cells 122 can be floating gate transistors (FGTs).

Figure 1D:
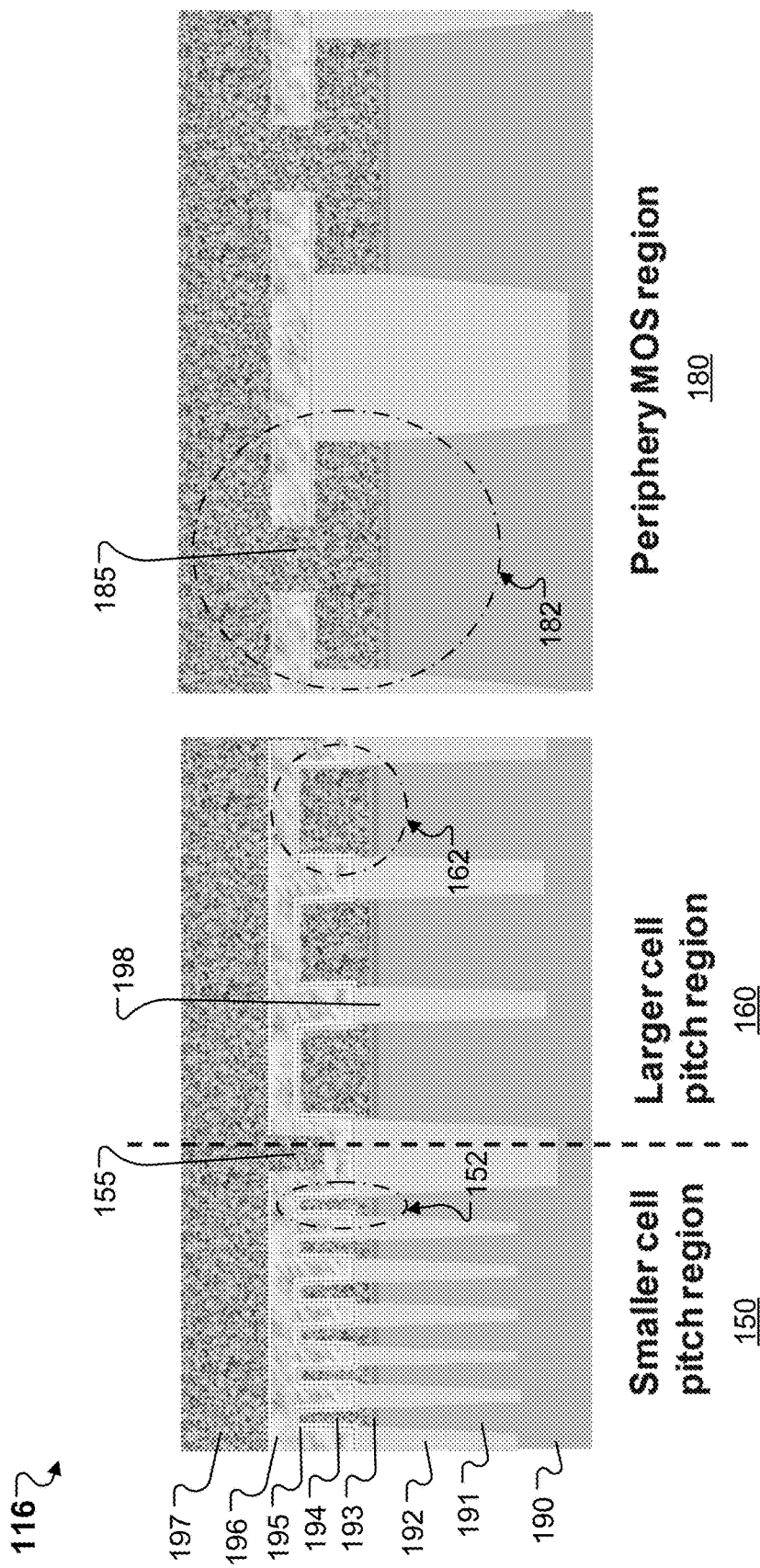
FIG. 1D is a cross-sectional view of a cell region and periphery region of the memory of FIG. 1A, according to one or more implementations.

FIG. 1D shows a cross-sectional view of example cell regions 150 and 160 and periphery MOS region 180 in the memory 116. In one fabrication process, as illustrated with further details in FIGS. 2A-2P, memory cells 152 with a smaller cell pitch can be formed in the smaller cell pitch region 150. Memory cells 162 with a larger cell pitch can be formed in the larger cell pitch region 160. MOS transistors 182 with a width larger than the smaller and larger cell pitches can be formed in the periphery MOS region 180. The memory cells 152 and 162 are, for example, floating gate transistors. The smaller cell pitch region 150 and the larger cell pitch region 160 can be separated by a mark, e.g., a recess 155.

The memory cells 152, the memory cells 162, and the MOS transistors 182 are formed on a same semiconductor substrate 190. The substrate 190 includes a plurality of active regions 191 protruded therefrom. Sidewalls (or side walls) of adjacent active regions 191 define a trench 198 therebetween. An isolation layer 192 fills in the trenches 198 and extends along the sidewalls of the active regions 191.

Each floating gate 194 is positioned on top of a respective active region 191 and is insulated from the active region 191 by a tunnel insulating layer 193, e.g., a tunnel oxide layer. The floating gate 194 can be self-aligned with the active region 191. For example, the floating gate 194 and the active region 191 can be fabricated in the same process and no extra step is needed to align the floating gate 194 and the active region 191. After the fabrication, a center line of the floating gate 194 is aligned with a center line of the active region 191, e.g., the two center lines are the same.

As discussed with further details below, the floating gate 194 is a charge storage gate. A width of the floating gate 194 can be referred to as a cell line width. A width between adjacent floating gates 194 can be referred to as a cell spacing. A sum of the cell line width and the cell spacing can be referred to as a cell pitch. The cell line width can be a half of the cell pitch. As illustrated in FIG. 1D and FIG. 2I below, the memory cell 152 has a smaller floating gate width (W) (thus a smaller cell line width) than a floating gate width (W') of the memory cell 162. The MOS transistor 182 has a larger gate width (W") than the floating gate width (W') of the memory cell 162.

A control gate layer 196 is positioned on top of the floating gates 194 and acts as a control gate for each memory cell 152, 162. The floating gates 194 are insulated from the control gate layer 196 by an inter-gate dielectric layer 195. A bottom surface of the inter-gate dielectric layer 195 (or a top surface of the isolation layer 192) is lower than a top surface of the floating gate 194 and higher than a top surface of the tunnel insulating layer 193. In a particular example, the top surface of the isolation layer 192 is formed to be at a substantially similar level as the top surface of the isolation layer 192. The inter-gate dielectric layer 195 defines recesses between adjacent floating gates 194, where the control gate layer 196 fills in the recesses.

The floating gate 194 can be electrically coupled with the control gate layer 196 along a contour profile of the inter-gate dielectric layer 195. A height of the recess can be defined as a vertical distance between a top surface of the floating gate 194 and a bottom surface of the inter-gate dielectric layer 195 at the bottom of the recess. In some cases, the coupling between the floating gate 194 and the control gate layer 196 occurs along the height, and the height H can be referred to as effective field height (EFH).

Impurity regions, e.g., source/drain regions, can be formed in the active regions 191. As illustrated in FIG. 1D, a memory cell 152 or 162, e.g., a floating gate transistor, can be provided at intersections between the control gate layer 196 and a respective active region 191. For example, the memory cell 152 or 162 is provided at an overlap between the control gate layer 196 and the respective active region 191.

For the MOS transistor 182 in the periphery MOS region 180, the control gate 196 is opened with an opening 185. An additional conductive layer 197 is formed on top of the control gate layer 196 and connected to the floating gate 194 through the opening 185 to form a common gate. The conductive layer 197 can be made of the same material as the floating gate 194, e.g., polycrystalline silicon (polysilicon or poly-Si).

Electrons are injected into the floating gate 194 from a channel and are injected into the channel from the floating gate 194, e.g., by a Fowler-Nordheim (F-N) tunneling current, thereby programming and erasing data in a memory cell 152 or 162 of the non-volatile memory 116. When the electrons are injected into the floating gate 194, a potential energy of the floating gate 194 is changed, and thus a threshold voltage of a transistor is varied in accordance with the potential energy change. As a result, data are programmed into the memory cell 152 or 162 of the non-volatile memory 116. When the F-N tunneling current flows across the tunnel insulating layer 193, the electrons in the floating gate 194 are extracted into the channel, thereby erasing the data in the memory cell 152 or 162 of the non-volatile memory 116.

The non-volatile memory 116 can be operated at a time when a control gate voltage, which is a voltage applied to the control gate 196 from a power source, is applied to the floating gate 194. A voltage on the floating gate can be referred to as a floating gate voltage. Accordingly, a ratio of the floating gate voltage with respect to the control gate voltage has an effect on operation characteristics of the non-volatile memory 116. The ratio can be related to a gate-coupling ratio (GCR) defined as a ratio of a capacitance between control gate and floating gate and a capacitance of floating gate. In some cases, the recess height may vary among the recesses defined by the inter-gate dielectric layer, e.g., due to fabrication instability or material defects. The variation of the recess height causes a variation of EFH, which can affect the coupling between the floating gate 194 and the control gate 196 to cause non-uniformity of GCR. Accordingly, a programming voltage, e.g., the control gate voltage, can be hard to control.

The non-volatile memory 116 can be configured to manage gate coupling between floating gate and control gate as described in U.S. patent application Ser. No. 15/849,971, entitled "MANAGING GATE COUPLING FOR MEMORY DEVICES" and filed on Dec. 21, 2017, whose content is hereby incorporated by reference in its entirety. For example, a floating gate can include multiple parts, such as a lower floating gate and an upper floating gate that are sequentially stacked together. The lower floating gate can be made of a material having a different property from a material of the upper floating gate, such that the lower floating gate can have different etching characteristics than the upper floating gate. For example, the lower floating gate and the upper floating gate can be made of polysilicon (polycrystalline silicon) and the lower floating gate can include polysilicon with a smaller grain size than the upper floating gate. When etching through the floating gate into the semiconductor substrate, e.g., during an shallow trench isolation (STI) etching process, the etching process can be controlled such that the lower floating gate has a higher etching rate than the upper floating gate. As a result, the lower floating gate can have a smaller width than the upper floating gate after the etching process. Then, a later-on deposited isolation layer, e.g., spin-on dielectric (SOD) material, can fill in a space between sidewalls of the lower floating gate and an inter-gate dielectric layer. As separation between a control gate layer and the lower floating gate is increased by the filled-in material of the isolation layer between the sidewalls of the lower gate and the dielectric layer, coupling between the floating gate and the control gate layer can be decreased. This decrease can reduce non-uniformity of GCR due to a variation of EFH in the recesses between adjacent gates.

Figure 2A:
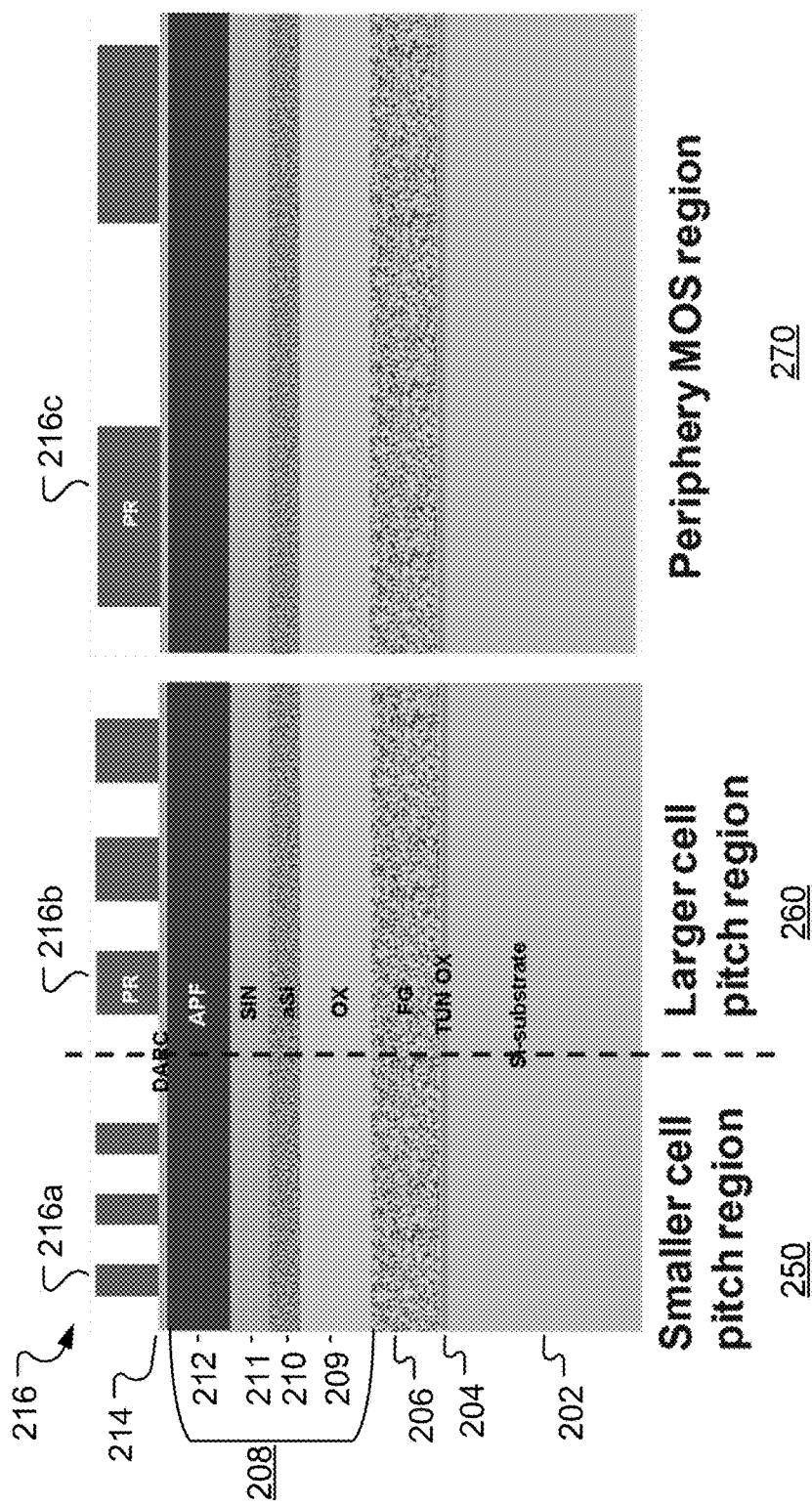
FIGS. 2A-2P are cross-sectional views illustrating process steps of a method of fabricating a non-volatile memory device having patterns with different feature sizes, according to one or more implementations.
Figure 2B:
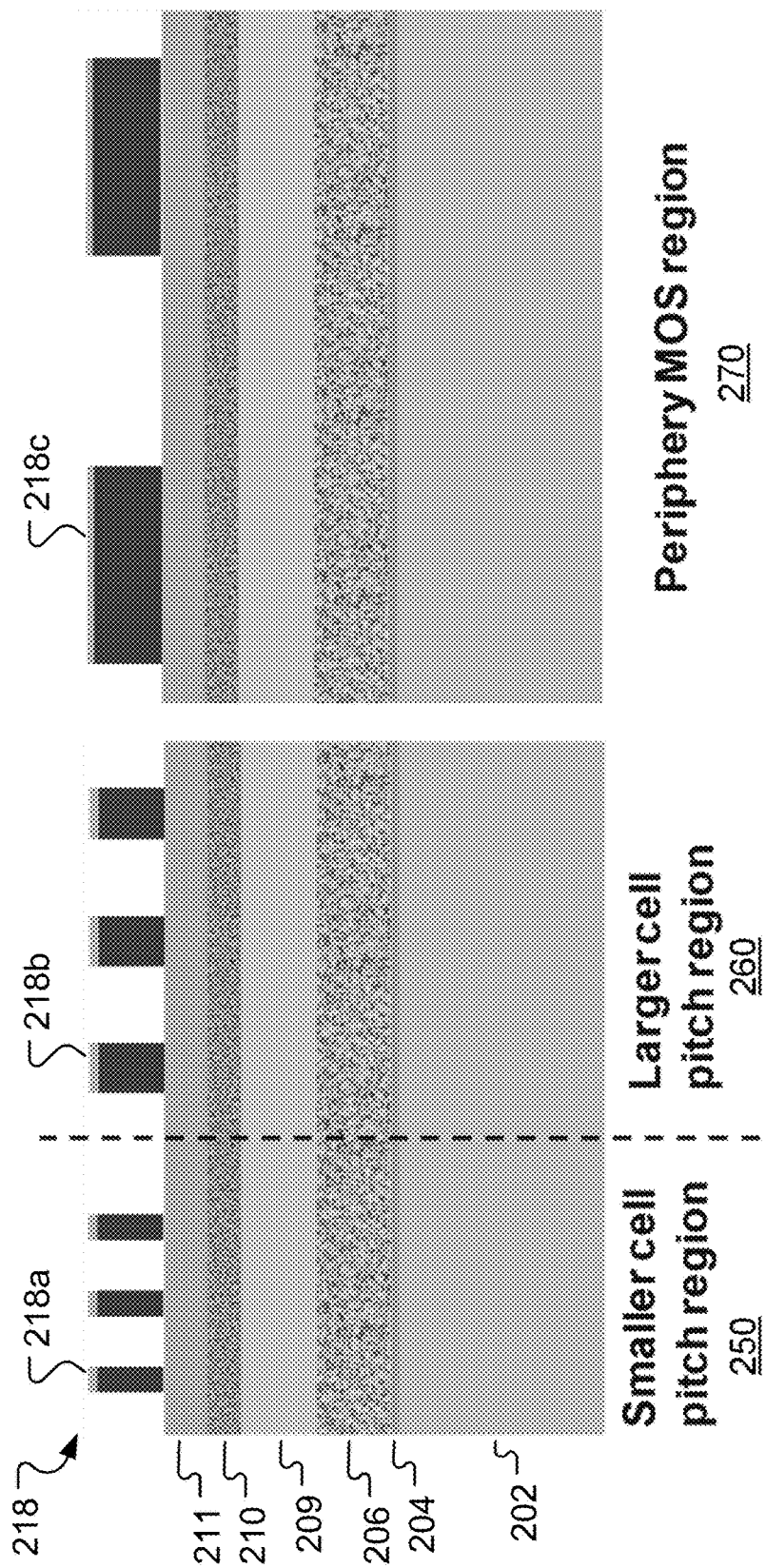
Figure 2C:
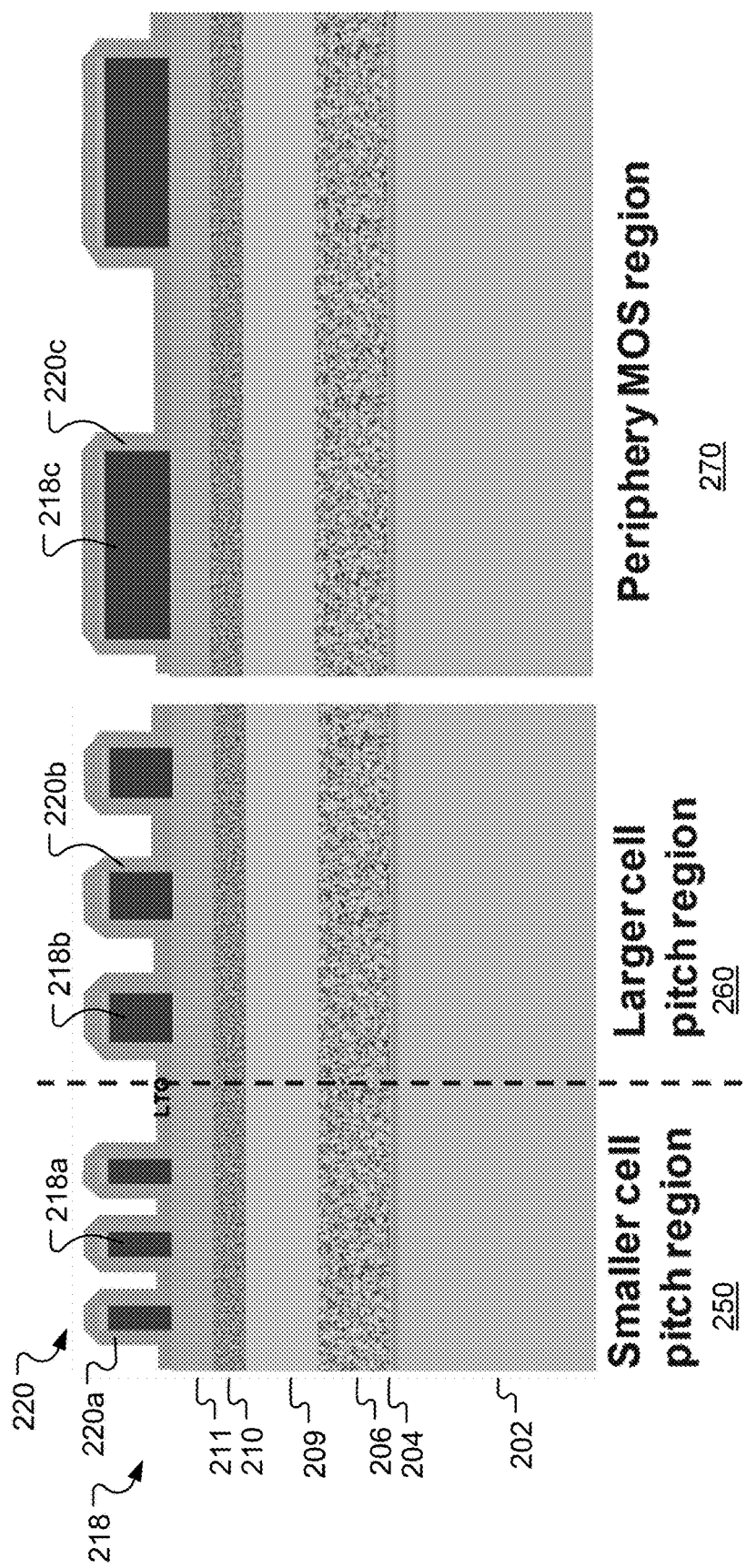
Figure 2D:
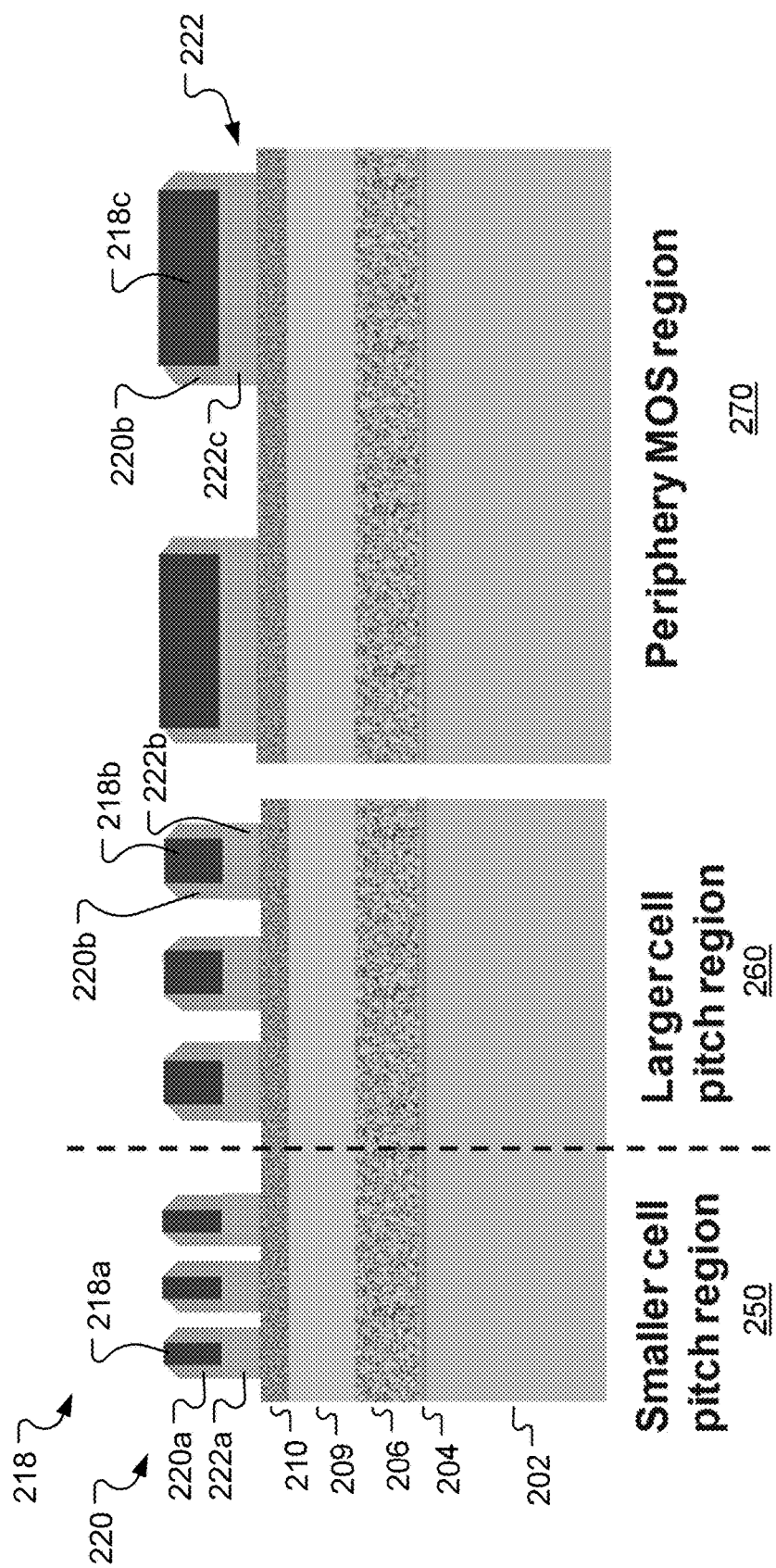
Figure 2E:
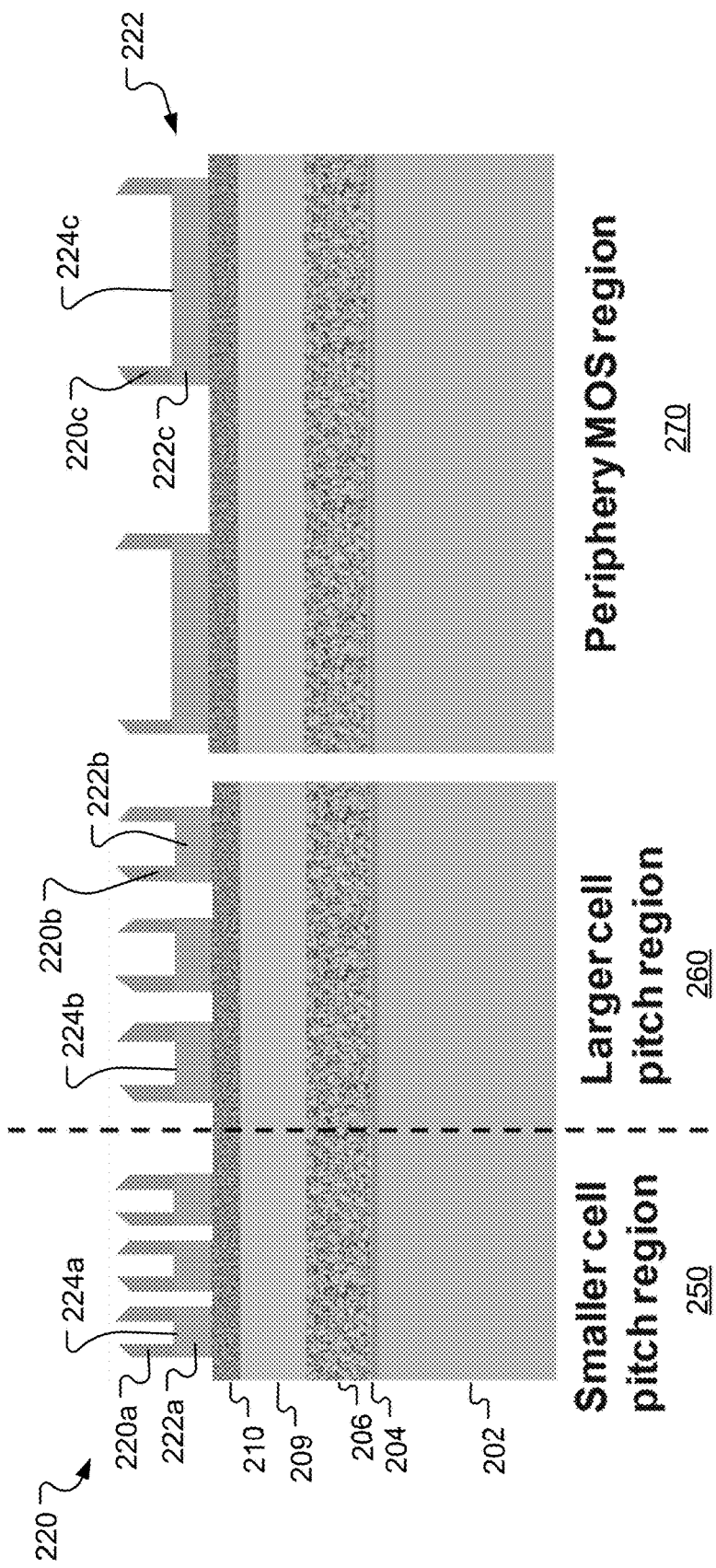
Figure 2F:
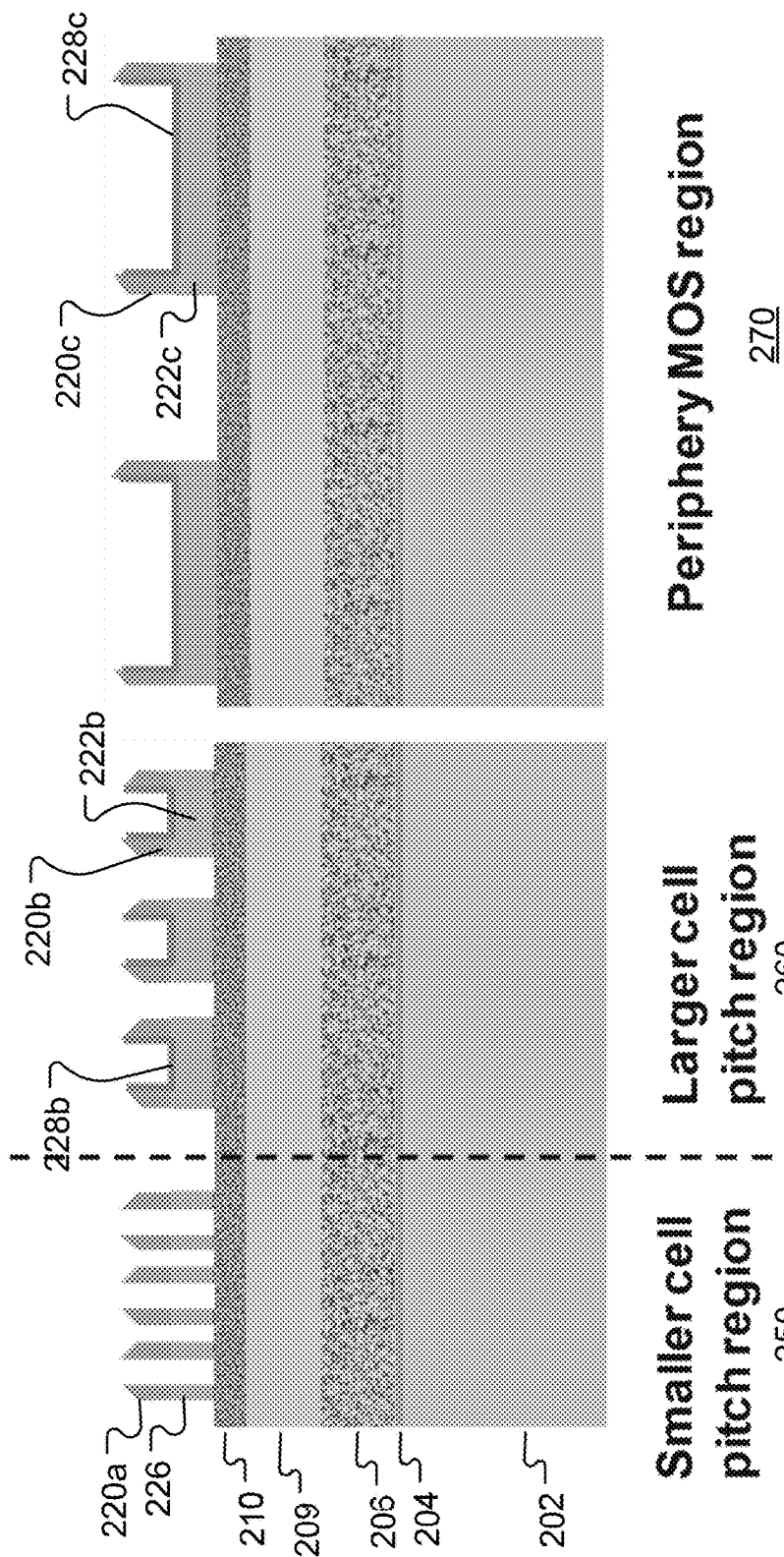
Figure 2G:
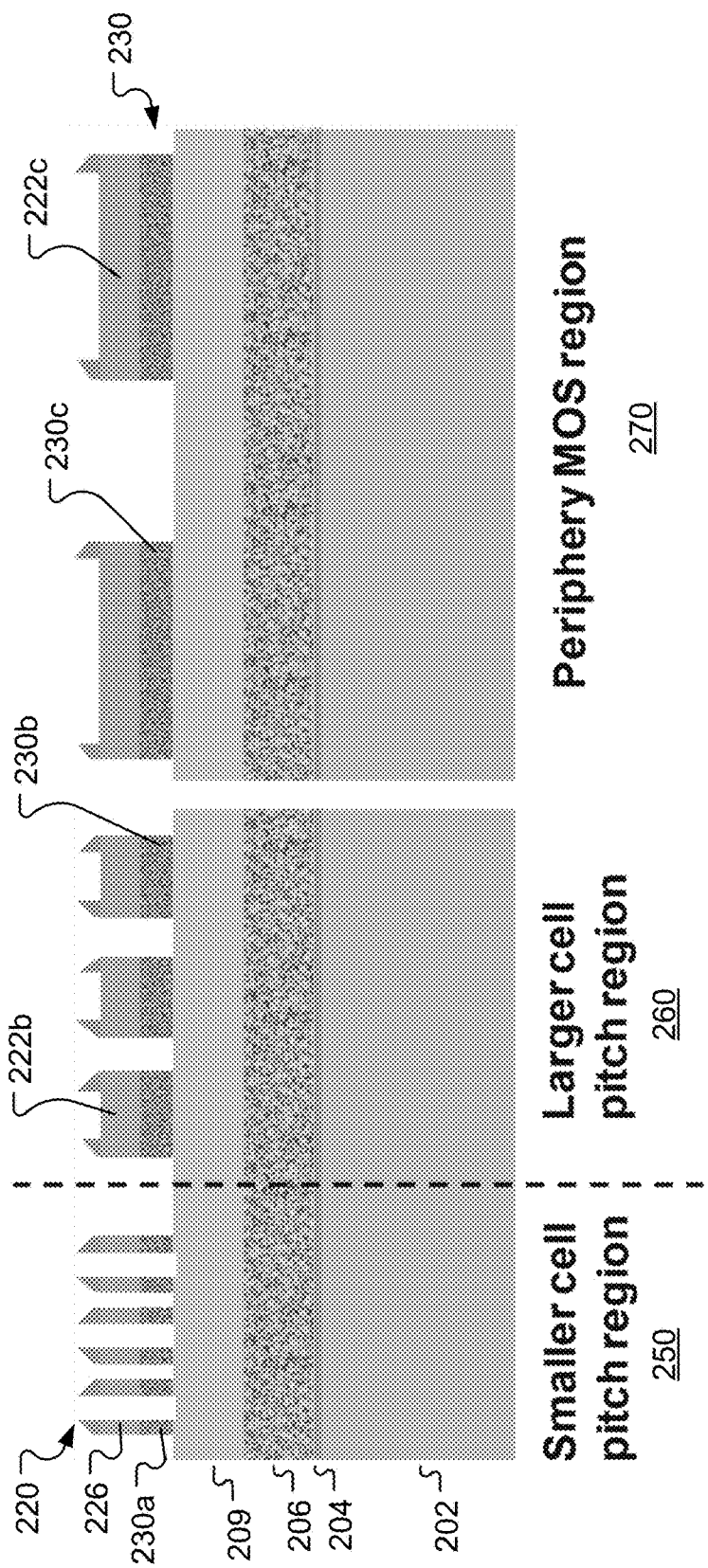
Figure 2H:
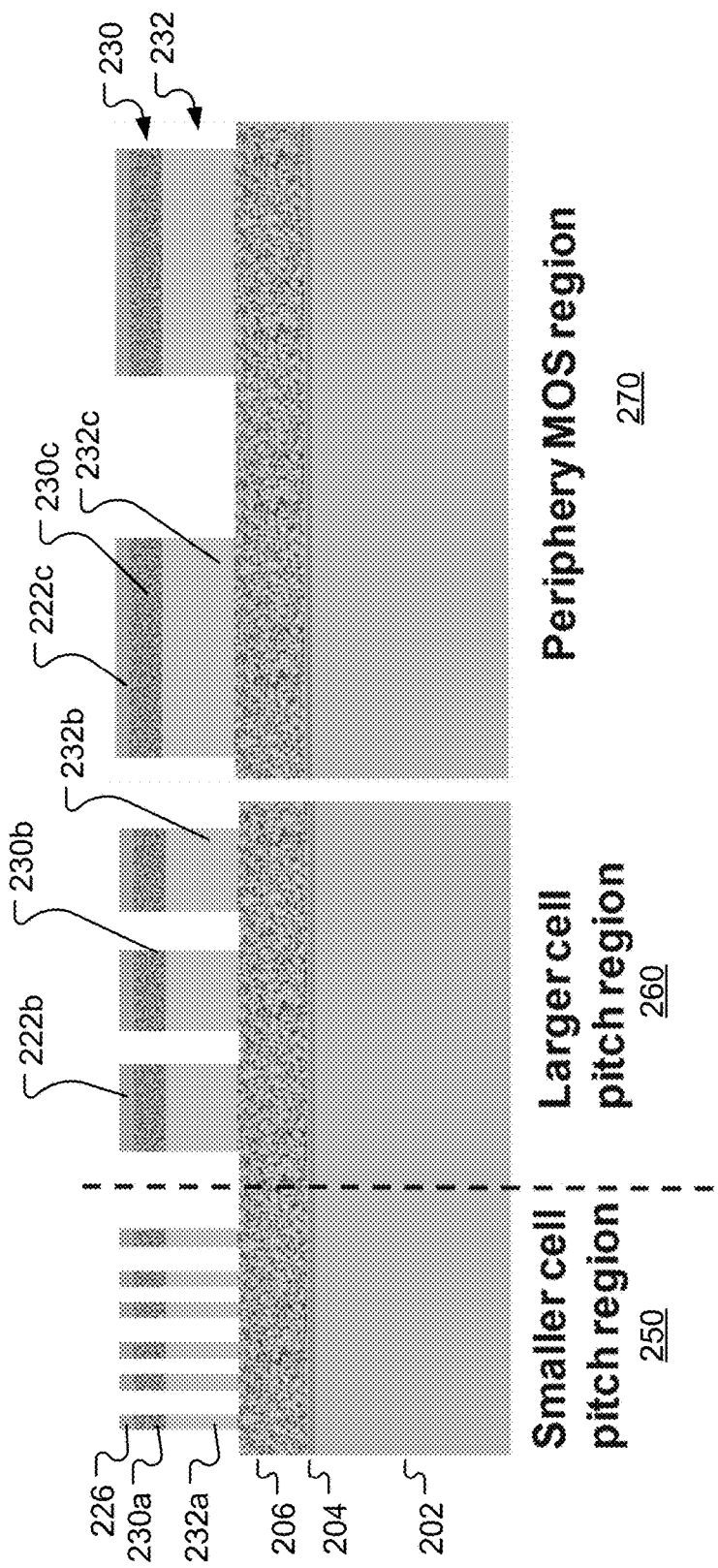
Figure 2I:
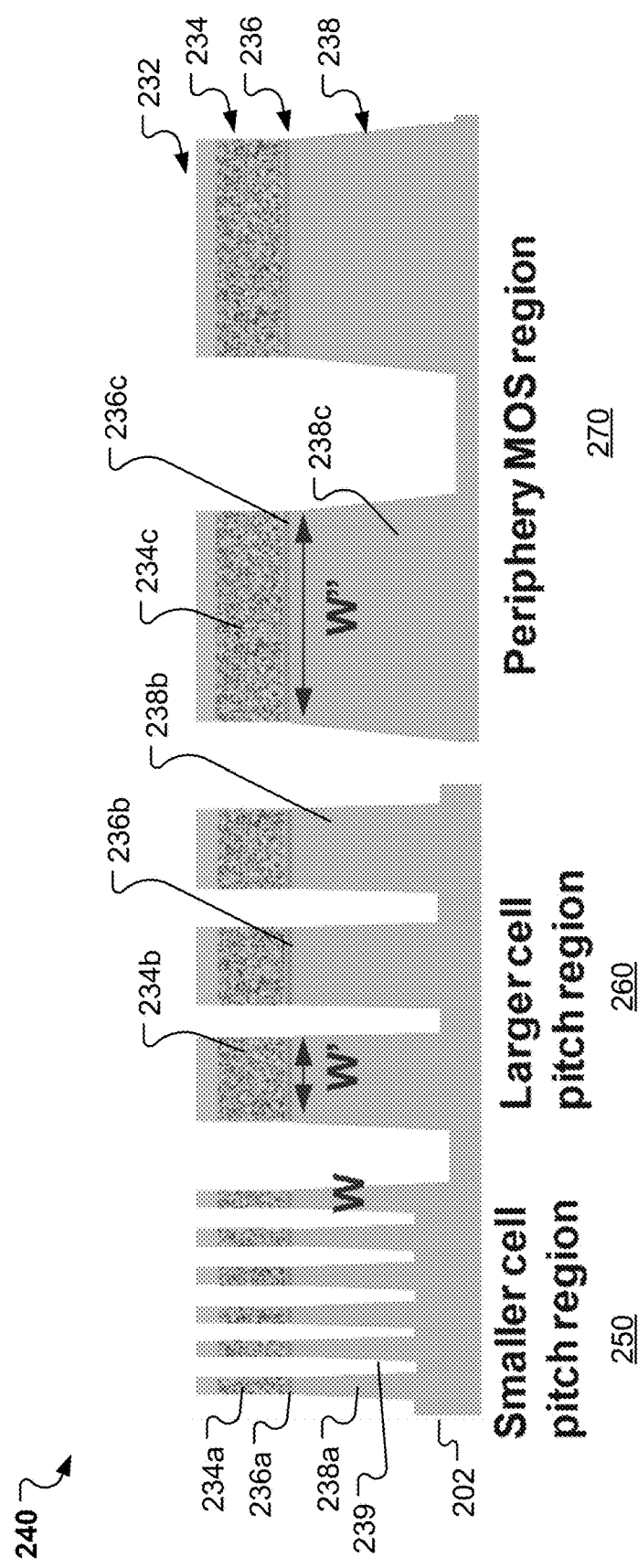
Figure 2J:
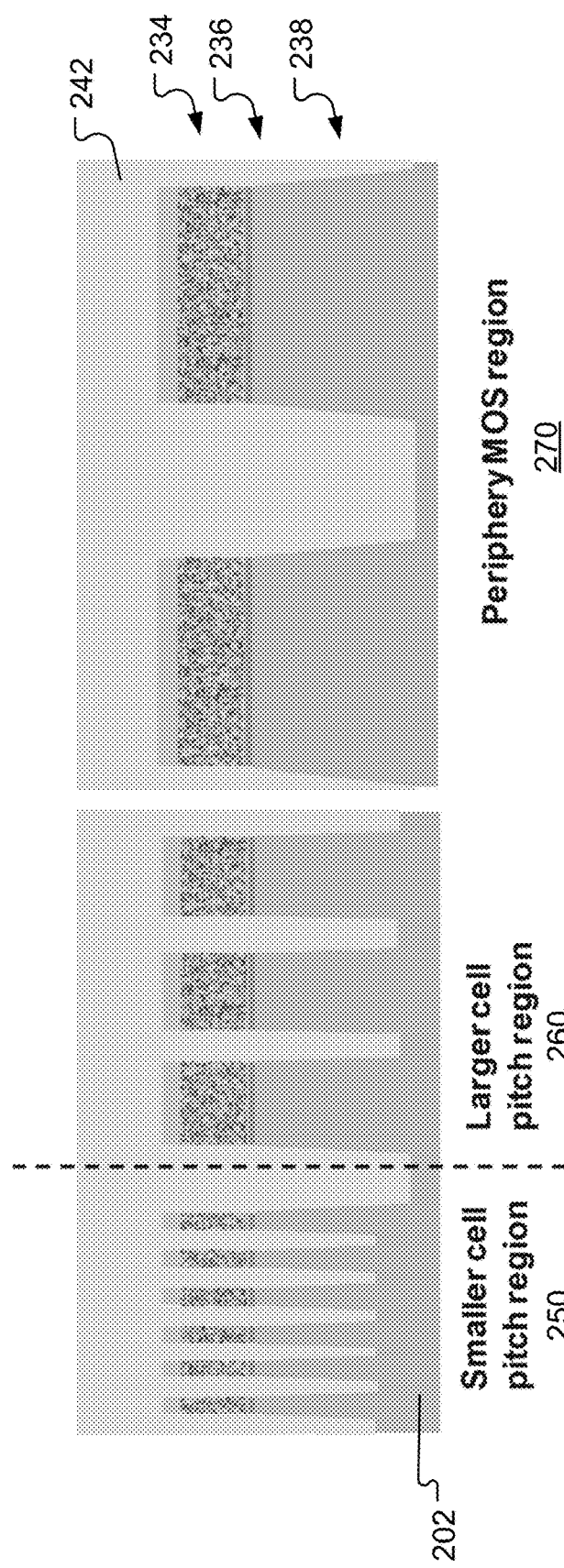
Figure 2K:
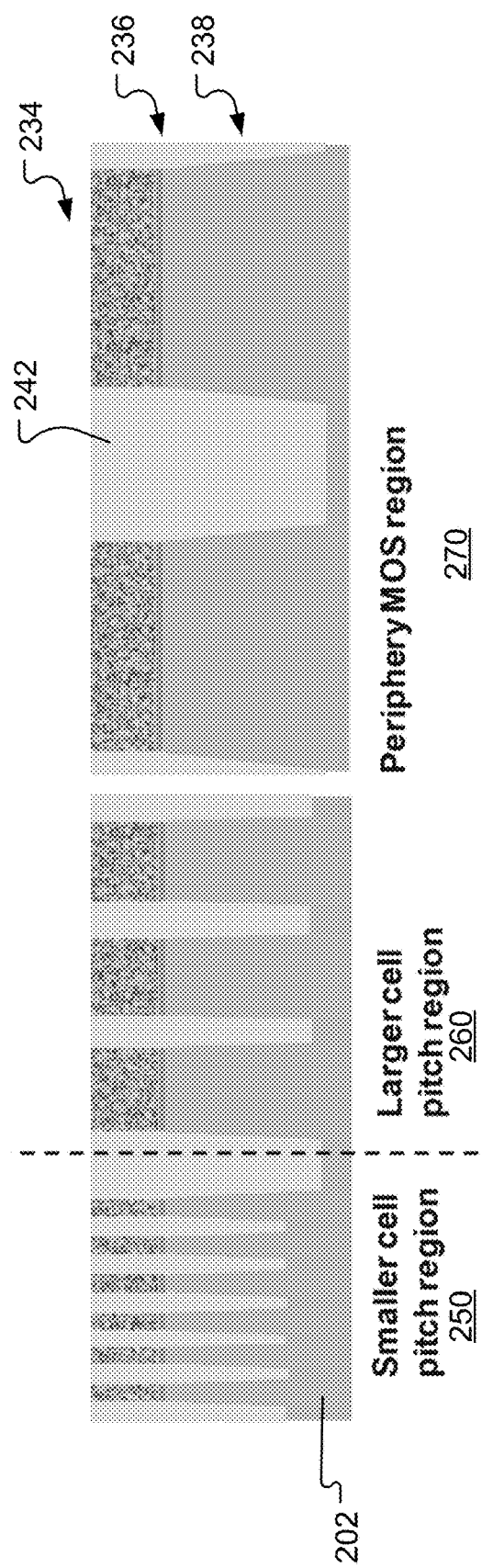
Figure 2L:
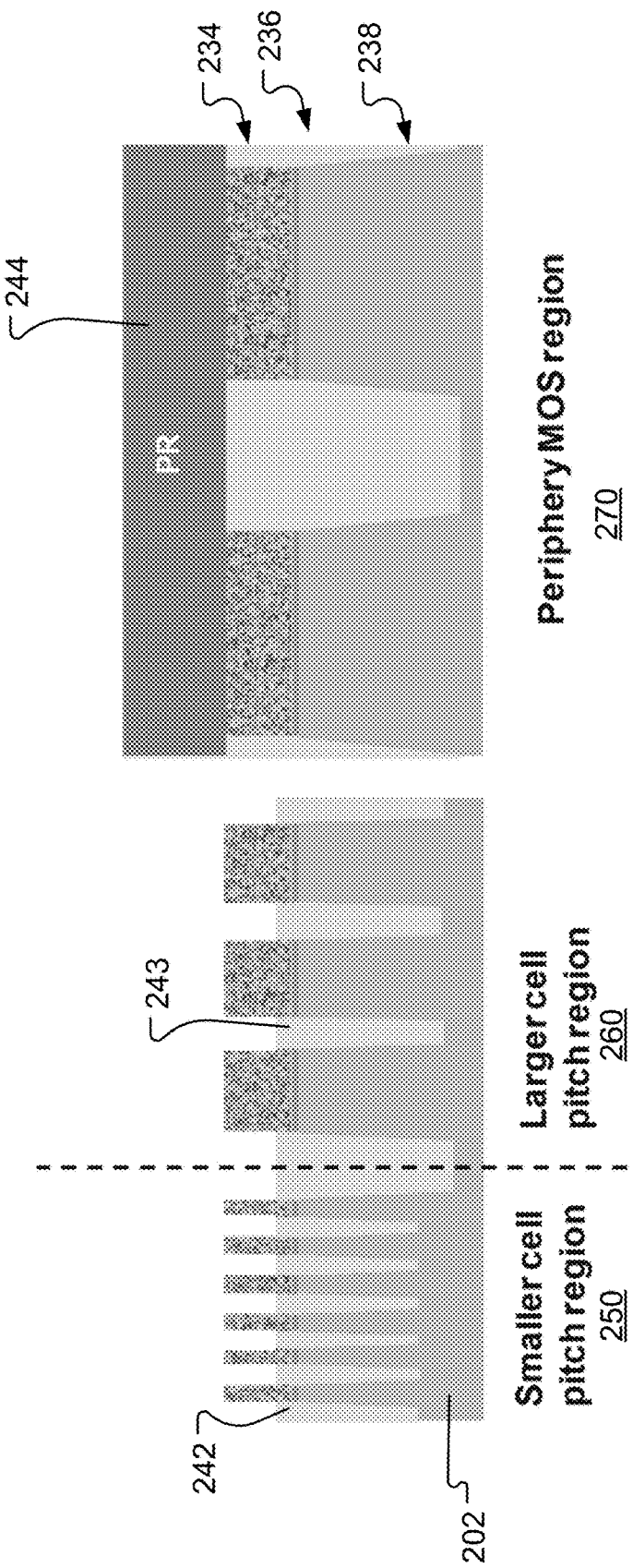
Figure 2M:
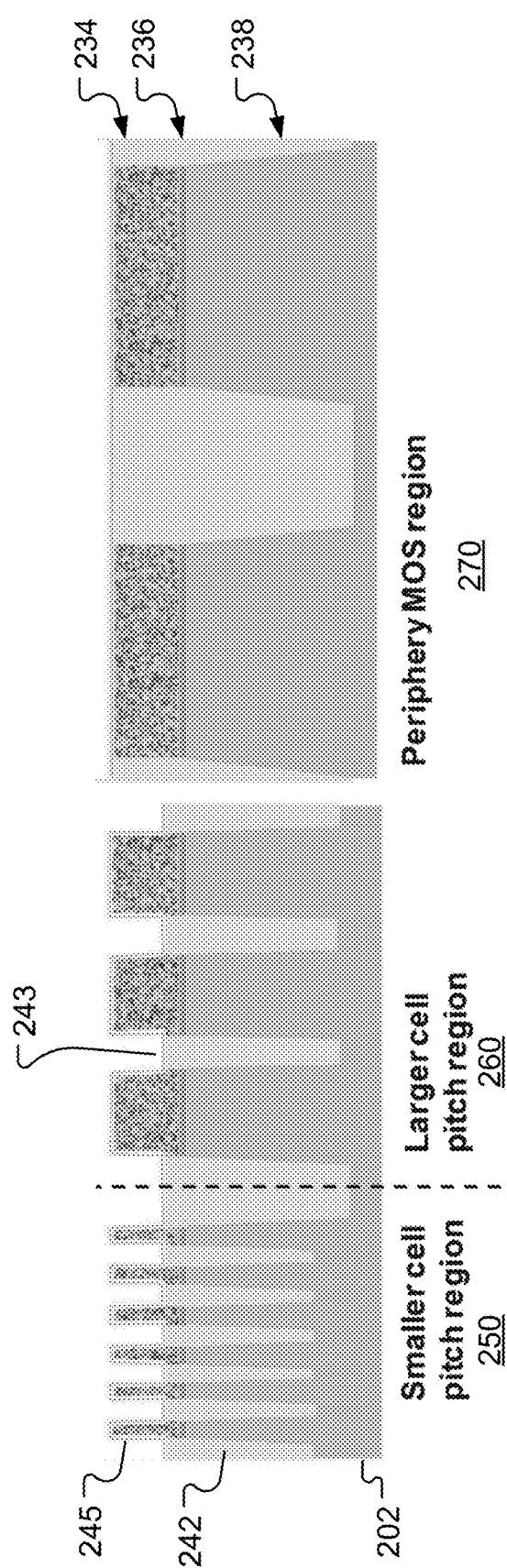
Figure 2N:
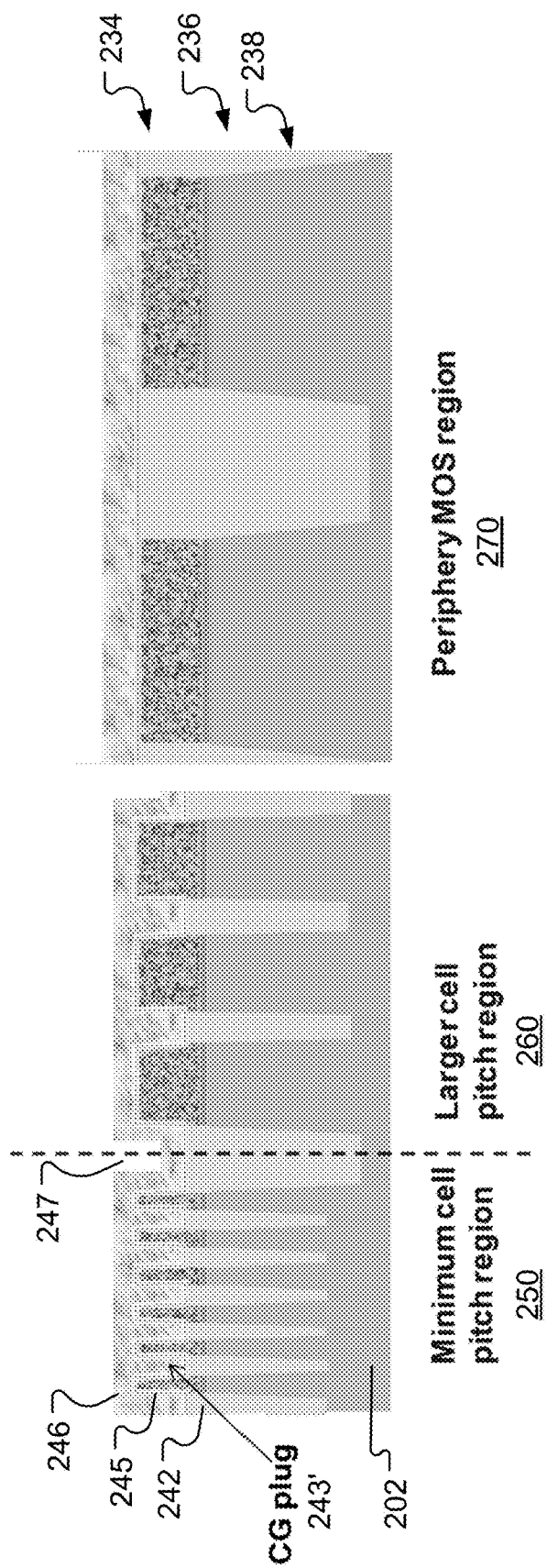
Figure 2O:
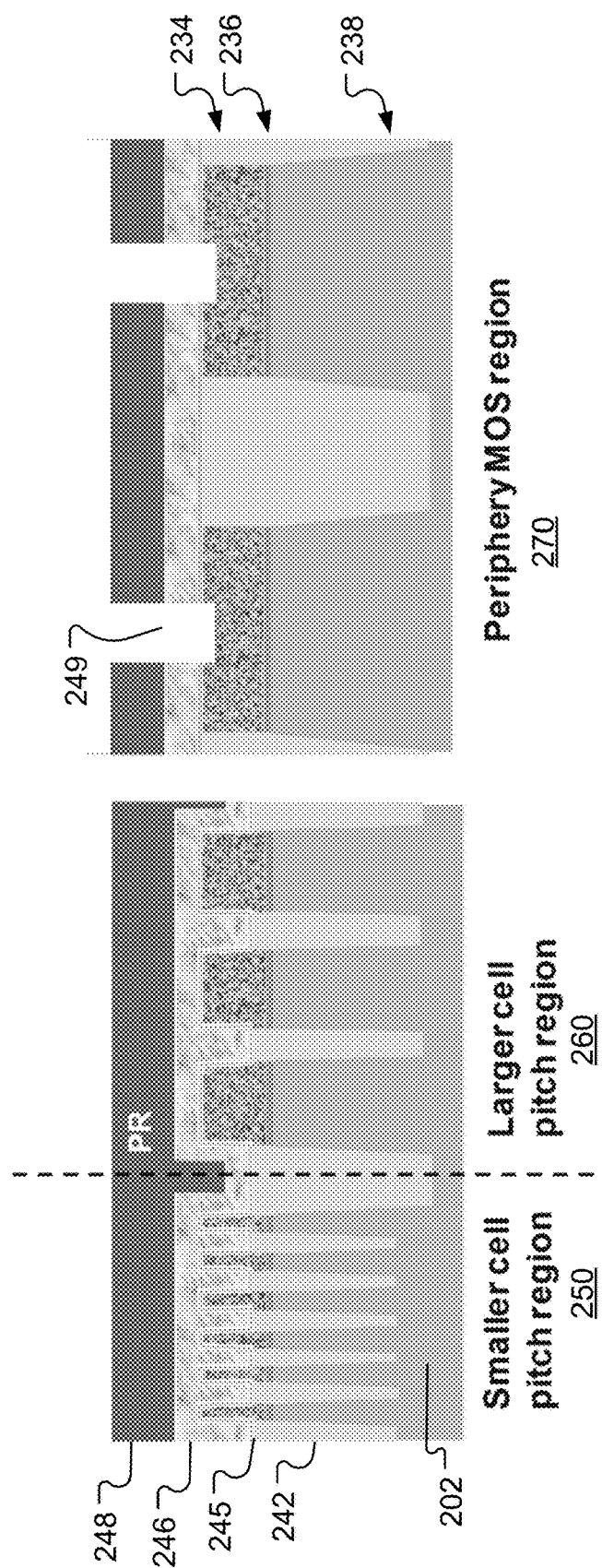
Figure 2P:
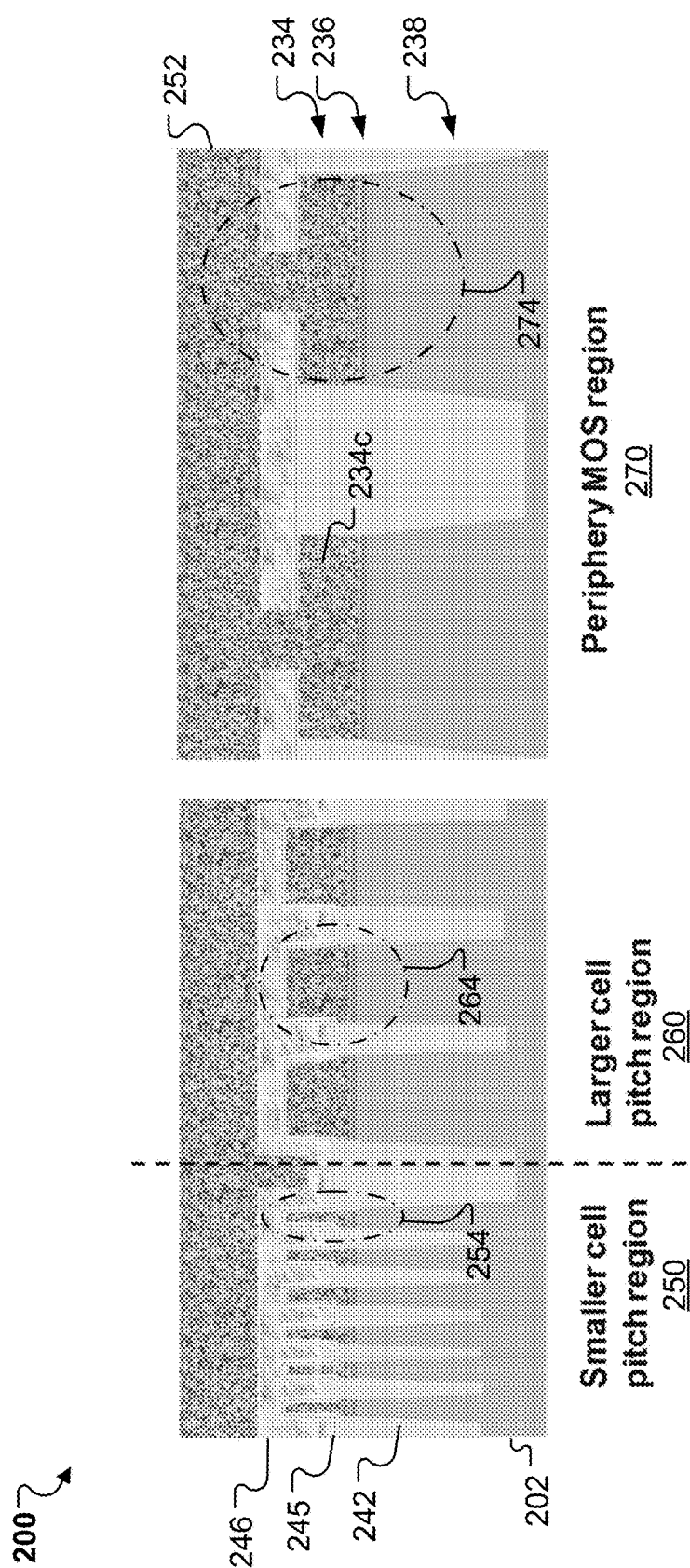

FIGS. 2A-2P are cross-sectional views illustrating process steps of a method of fabricating a non-volatile memory device 200. The fabricated non-volatile memory device 200 (as illustrated in FIG. 2P) can be the memory 116 of FIGS. 1A to 1D. The non-volatile memory device 200 includes a smaller cell pitch region 250, a larger cell pitch region 260, and a periphery MOS region 270 that can be integrated on a memory circuit.

Note that the method described herein can be also used to fabricate a non-volatile memory device having the smaller cell pitch region 250 and the larger cell pitch region 260, a non-volatile memory device having the smaller cell pitch region 250 and the periphery MOS region 270, or a non-volatile memory device having the larger cell pitch region 260 and the periphery MOS region 270.

As shown in FIG. 2A, the non-volatile memory device 200 is formed on a semiconductor substrate 202. The semiconductor substrate 202 can include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI). The semiconductor substrate 202 can also provide a base for subsequent processes and structures.

Referring to FIG. 2A, a floating gate (FG) layer 206 is provided on the semiconductor substrate 202, e.g., a silicon (Si) substrate. The floating gate layer 206 functions as a charge storage layer. It can be made of conductive material, e.g., polysilicon (PL). The floating gate layer can have a thickness of about 400 to 700 angstrom (Å).

In some implementations, the floating gate layer 206 includes an upper floating gate layer and a lower floating gate layer that are stacked together. The lower floating gate layer can function as a buffer layer to alleviate physical stress and/or gravity pressure on a tunnel insulating layer 204 formed between the floating gate layer 206 and the substrate 202. In some examples, the lower floating gate layer is made of polysilicon with a smaller grain size than the upper floating gate layer.

The tunnel insulating layer 204 can be a tunnel oxidation (TUN OX) layer and formed using a thermal oxidation technique. The tunnel insulating layer 204 can include Sift or SiON. The tunnel insulating layer 204 can have a thickness of about 50 to 70 Å.

A template hard mask (HM) 208 is formed on the floating gate layer 206. The template HM 208 forms a protective pattern for etching the floating gate layer 206, e.g., an etching mask. The template HM 208 can include any number of thin film layers to be applicable to SADP process. Particularly, as discussed with further details below, the template HM 208 includes a thin film layer made of a material that can generate heavy polymer behavior to create a loading effect during an etching process. The material can include silicon nitride (SiN).

In some implementations, as illustrated in FIG. 2A, the template HM 208 includes an oxide (OX) HM layer 209, an amorphous silicon (aSi) HM layer 210 (or polysilicon), a SiN HM layer 211, and an advanced patterning film (APF) 212 that are deposited, for example, sequentially, on the floating gate layer 206. In a particular example, the OX HM layer 209 has a thickness of 800 to 1500 Å, the aSi HM layer 210 has a thickness of 300 to 700 Å, the SiN HM layer 211 has a thickness of 300 to 700 Å, and the APF HM layer 212 has a thickness of 800 to 1200 Å.

A patterned photo resist (PR) mask 216 is disposed on the template HM 208. The patterned PR mask 216 can be formed by disposing a photo resist (PR) layer over the template HM 208 and lithographically patterning the PR layer to form discrete first PR features 216a in the region 250, discrete second PR features 216b in the region 260, and discrete third PR features 216c in the region 270.

A feature size or a critical dimension (CD), e.g., a width, of the first PR feature 216a is smaller than that of the second PR feature 216b that is smaller than that of the third PR feature 216c. As discussed below, a memory cell formed in the region 250 has a cell space associated with a gap width between the first PR features 216a. A memory cell formed in the region 260 has a cell line width associated with the feature size of the second PR feature 216b and a cell space associated with a gap width between the second PR features 216b. A MOS transistor formed in the region 270 has a width associated with the feature size of the third PR feature 216c and a space associated with a gap width between the third PR features 216c.

A dielectric anti-reflective coating (DARC) 214 is disposed over the template HM 208. The DARC 214 can serve as a stop layer during etching the PR layer to form the patterned PR mask 216. The DARC 214 can include a material, e.g., silicon oxide, silicon nitride, silicon oxynitride (SiON) or silicon carbon nitride. The DARC 214 can be sufficiently thick to inhibit the formation of pinholes that may undesirably expose the APF layer 212 to an etch process used to form a template mask, form a spacer mask or used to remove a template mask, as described elsewhere herein. In a particular example, the DARC 214 has a thickness of about 150 to 250 Å.

Referring to FIG. 2B, a first patterned HM 218 is formed by etching through the DARC 214 and the APF layer 212 masked by the patterned PR mask 216 and then removing the patterned PR mask 216. The first patterned HM 218 includes a first feature 218a transferred from the first PR feature 216a, a second feature 218b transferred from the second PR feature 216b, and a third feature 218c transferred from the third PR feature 216c. Accordingly, a CD of the first feature 218a is smaller than that of the second feature 218b that is smaller than that of the third feature 218c.

Referring to FIG. 2C, a spacer layer 220 is conformally deposited on the first patterned HM 218 and on the SiN HM layer 211. The spacer layer 220 also forms first sidewall spacers 220a adjacent to sidewalls of the first features 218a, second sidewall spacers 220b adjacent to sidewalls of the second features 218b, and third sidewall spacers 220c adjacent to sidewalls of the third features 218c. Each sidewall spacer 220a, 220b, 220c has a substantially same width, which is substantially identical to a thickness of the spacer layer 220 deposited on the SiN HM layer 211.

As discussed with further details below, a memory cell formed in the smaller cell pitch region 250 has a cell line width determined by the width of the sidewall spacer 220a, accordingly by the thickness of the deposited spacer layer 220. For example, the cell line width can be identical to the thickness of the deposited spacer layer 220. In some examples, the thickness of the deposited spacer layer 220 is in a range of approximately 10 nm to 36 nm.

Material of the spacer layer 220 can be different from the DARC 214, the APF layer 212, and the SiN HM layer 211, so as to ensure the material of the spacer layer 220 and the DARC 214, the APF layer 212, and the SiN HM layer 211 have a high selective etching ratio. The spacer layer 220 can be formed by any appropriate method, such as a spin-coating process, a CVD process, a PVD process, or an atomic layer deposition (ALD) process. In a particular example, the spacer layer 220 is a low temperature oxide (LTO) layer and formed by depositing dielectric silicon oxide by a CVD process at a low temperature.

The spacer layer 220 on top of the first patterned HM 218 and the SiN HM layer 211 is etched away to expose the first feature 218a, the second feature 218b, and the third feature 218c. The spacer layer 220 on the SiN HM layer 211 in recesses between adjacent sidewall spacers 220a, adjacent sidewall spacers 220b, and adjacent sidewall spacers 220c is also etched away to expose the SiN HM layer 211. Thus, the first feature 218a and the first sidewall spacers 220a, the second feature 218b and the second sidewall spacers 220b, and the third feature 218c and the third sidewall spacers 220c form a new patterned mask for the SiN HM layer 211. Also, the DARC 214 on the first feature 218a, the second feature 218b, and the third feature 218c is also removed to expose the patterned APF layer 212 at core positions between the sidewall spacers 220a, 220b, 220c.

With the new patterned mask, the SiN HM layer 211 in the recesses is etched through to expose the underlying aSi HM layer 210. A second patterned HM 222 is formed in the SiN HM layer 211 and under the new patterned mask, as illustrated in FIG. 2D. The second patterned HM 222 includes new first features 222a, new second features 222b, and new third features 222c. Each new first feature 222a is under the first sidewall spacers 220a and the first feature 218a. Each new second feature 222b is under the second sidewall spacers 220b and the second feature 218b. Each new third feature 222c is under the third sidewall spacers 220c and the third feature 218c.

Referring to FIGS. 2D-2I, a memory cell formed in the larger cell pitch region 260 has a cell line width corresponding to the CD of the new second feature 222b, which can be a sum of the CD of the second feature 218b (e.g., the CD of the second PR feature 216b) and twice of the CD of the second sidewall spacers 220b (e.g., twice of the thickness of the deposited spacer layer 220). A MOS transistor formed in the region 270 has a width corresponding to the CD of the new second feature 222c, which can be a sum of the CD of the third feature 218c (e.g., the CD of the third PR feature 216c) and twice of the CD of the third sidewall spacers 220c (e.g., twice of the thickness of the deposited spacer layer 220).

The patterned APF layer 212 at the core positions between the sidewall spacers 220a, 220b, 220c is removed, e.g., by dry stripping, to expose a first portion 224a of the SiN HM layer 211, a second portion 224b of the SiN HM layer 211, and a third portion 224c of the SiN HM layer 211, respectively, as illustrated in FIG. 2E. The first portion 224a is between the first sidewall spacers 220a, the second portion 224b is between the second sidewall spacers 220b, and the third portion 224c is between the third sidewall spacers 220c.

The first portion 224a corresponds to the first feature 218a and has a same CD as the first feature 218a. The CD can be a width or a surface area. The second portion 224b corresponds to the second feature 218b and has a same CD as the second feature 218b. The third portion 224c corresponds to the third feature 218c and has a same CD as the third feature 218c. Thus, the third portion 224c has a larger CD than the second portion 224b that has a larger CD than the first portion 224a.

An etching process is performed to etch the SiN HM layer 211. Material of the SiN HM layer 211, e.g., SiN, can react with an etching gas, e.g., $C_xF_y$, $CH_x$, $CH_xF_y$, Ar, $O_2$, or any combination thereof, during the etching process. As the second portion 224b has a larger CD thus a larger surface area, more SiN material reacts with the etching gas to generate more polymer on a surface of the second portion 224b than the first portion 224a. The etching process can be controlled, e.g., by controlling a flowing rate of the etching gas, such that the polymer generated on the second portion 224b is enough to form a protective layer 228b for protecting the second portion 224b from etching, and that polymer generated on the first portion 224a is not enough to form a protective layer to protect the first portion 224a from etching. As a result, as illustrated in FIG. 2F, the first portion 224a is etched through and a smaller feature 226 is formed masked by the first sidewall spacers 220a. The formed smaller feature 226 has a same CD as the CD of the first sidewall spacers 220a. The second portion 224b is protected by the protective layer 228b from etching. The third portion 224c has a larger surface area than the second portion 224b, and a protective layer 228c is also generated on the surface of the third portion 224c during the etching process, thus the third portion 224c is also protected by the protective layer 228c from etching.

Referring to FIG. 2G, a third HM pattern 230 is formed in the aSi HM layer 210 by etching through the aSi HM layer 210 with the smaller features 226, the new second features 222b, and the new third features 222c as a patterned mask. The third HM pattern 230 includes smaller features 230a formed in the smaller cell pitch region 250, first larger features 230b formed in the larger cell pitch region 260, and second larger features 230c formed in the periphery MOS region 270.

The new second features 222b are the SiN HM layer under the second portion 224b and the second sidewall spacers 220b. The new third features 222c are the SiN HM layer under the second portion 224c and the second sidewall spacers 220c. The sidewall spacers 220a, 220b, and 220c are also etched during the etching. There can be remaining sidewall spacers on the third HM pattern 230 after the etching.

Referring to FIG. 2H, a fourth HM pattern 232 is formed in the oxide HM layer 209 by etching through the oxide HM layer 209 with the third HM pattern 230 as a patterned mask. The fourth HM pattern 232 includes smaller features 232a transferred from smaller features 230a, first larger features 232b transferred from first larger features 230b, and second larger features 232c transferred from second larger features 230c. The patterned SiN HM layer including features 226, 222b, and 222c is also etched during etching the oxide HM layer 209, and there may be remaining SiN HM layer on the third HM pattern 230 and the fourth HM pattern 232.

Referring to FIG. 2I, a shallow trench isolation (STI) pattern 240 is formed by etching through the floating gate layer 206 and the tunnel insulating layer 204 into the semiconductor substrate 202 with the fourth HM pattern 232 (and/or the third HM pattern 230) as a patterned mask. As discussed below, the STI pattern 240 includes a plurality of individual regions fabricated as a transistor, e.g., a floating gate transistor as a memory cell or a MOS transistor. The etching can include dry etching such as reactive ion etching (RIE). The third HM pattern 230 and the fourth HM pattern 232 are also etched during the STI etching, and there may be remaining fourth HM pattern 232.

The floating gate layer 206 is etched through to form discrete floating gates 234, including floating gates 234a in the smaller cell pitch region 250, floating gates 234b in the larger cell pitch region 260, and floating gates 234c in the periphery MOS region 270.

A cell pitch of a memory cell is a sum of a cell line width and a space from adjacent memory cell. A memory cell formed in the smaller cell pitch region 250 has the floating gate 234a as a charge storage gate. A cell line width of the smaller pitch memory cell is determined by a width W of the floating gate 234a, e.g., the cell line width is identical to the width W. As discussed above, the width W is determined by the width of the first sidewall spacer 220a that is determined by the thickness h of the deposited spacer layer 220, e.g., W=h. A space of the memory cell can be defined as a width of a recess between adjacent floating gates 234a. As illustrated above, in some cases, the recess width is determined by the width of the first PR feature 216a. In some cases, the recess width is determined by a space between adjacent first PR features 216a and the thickness of the deposited spacer layer 220, e.g., the recess width is identical to the first PR feature space minus twice of the spacer layer thickness.

A memory cell formed in the larger cell pitch region 260 has the floating gate 234b as a charge storage gate. A cell line width of the larger pitch memory cell is determined by a width W' of the floating gate 234b, e.g., the cell line width is identical to the width W'. As discussed above, the width W' is determined by the width $W_{2ndPR}$ of the second PR feature 216b and the width of the second sidewall spacer 220b that is determined by the thickness h of the deposited spacer layer 220, e.g., $W'=W_{2ndPR}+2*h$. A space of the memory cell can be defined as a width of a recess between adjacent floating gates 234b. As illustrated above, the recess width is determined by a space between adjacent second PR features 216b and the thickness of the deposited spacer layer 220, e.g., the recess width is identical to the second PR feature space minus twice of the spacer layer thickness 2*h.

A MOS transistor formed in the periphery MOS region 270 has the floating gate 234c. A width of the MOS transistor is determined by a width W" of the floating gate 234c, e.g., the transistor width is identical to the width W". As discussed above, the width W" is determined by the width $W_{3rdPR}$ of the third PR feature 216c and the width of the third sidewall spacer 220c that is determined by the thickness h of the deposited spacer layer 220, e.g., $W"=W_{3rdPR}+2*h$. A space of the MOS transistor can be defined as a width of a recess between adjacent floating gates 234c. As illustrated above, the recess width is determined by a space between adjacent third PR features 216c and the thickness of the deposited spacer layer 220, e.g., the recess width is identical to the third PR feature space minus twice of the spacer layer thickness 2*h.

In a particular example, the width W of the floating gate 234a is within a range of 19 nm to 36 nm, the width W' of the floating gate 234b is within a range of 60 nm to 90 nm, and the width W" of the floating gate 234c can be larger than 300 nm.

The tunnel insulating layer 204 is etched through to form discrete tunnel insulators, including tunnel insulators 236a in the smaller cell pitch region 250, tunnel insulators 236b in the larger cell pitch region 260, and tunnel insulators 236c in the periphery MOS region 270.

The STI pattern 240 also includes individual active regions 238 formed in the semiconductor substrate 202. Each active region corresponds to a respective floating gate disposed above. For example, an active region 238a corresponds to a floating gate 236a, an active region 238b corresponds to a floating gate 236b, and an active region 238c corresponds to a floating gate 236c.

Adjacent active regions 238 define trenches 239 therebetween. The trenches 239 can have a rectangular shape, a "V" shape, a "U" shape, or any suitable shape. For illustration only, in FIG. 2I, the trench 239 has a trapezoid shape with a width increasing from a bottom surface to a top surface along the sidewalls of the active regions. The trenches connect to gaps between the sidewalls of adjacent floating gates.

FIGS. 2J to 2P illustrate process steps to form the non-volatile memory device 200 based on the STI pattern 240 formed in the semiconductor substrate 202, e.g., to form smaller pitch memory cells in the smaller cell pitch region 250, larger pitch memory cells in the larger cell pitch region 260, and MOS transistors in the periphery MOS region 270.

Referring to FIG. 2J, an isolation layer 242 is formed on top of the STI pattern 240 and fills in the trenches and the recesses between floating gates and between active regions. In some examples, the isolation layer 242 is formed by adopting spin-on dielectric (SOD) approach, e.g., due to high aspect ratio in the smaller cell pitch region 250. The isolation layer 242 can be also formed by any other suitable material having high fill-in ability.

The STI pattern 240 is filled in with the material of the isolation layer 242 is polished for topology planarization, e.g., by Chemical mechanical polishing/planarization (CMP) process. The process can proceed until end in the upper part of floating gates 234, as illustrated in FIG. 2K.

The isolation layer 242 is etched to form recesses 243 between adjacent floating gates, e.g., by array (ARY) OX etching, SiCoNi etching or other high selective anisotropic etching tool, in memory cell regions including the smaller cell pitch region 250 and the larger cell pitch region 260, as illustrated in FIG. 2L. The periphery MOS region 270 is protected from etching, e.g., by using a photolithography process to selectively deposit a photo resist (PR) layer 244 on top of the periphery MOS region 270.

The isolation layer 242 is etched until the top surface of the remaining isolation layer is close to a bottom surface of the floating gate but above the top surface of the tunnel isolator. In some implementations, as discussed above, the floating gate can include an upper floating gate and a lower floating gate. The top surface of the remaining isolation layer 242 (or bottom surfaces of the recess 243) can be at a substantially same level as the bottom surface of the floating gate (or a top surface of the lower floating gate). In some cases, the top surface of the remaining isolation layer 242 can be between the top surface and the bottom surface of the lower floating gate.

In some cases, the bottom surfaces of the recesses 243 may vary, and there may be a variation of EFH for the recesses 243. As noted above, to achieve high gate coupling ratio (GCR) and reduce the effect of EFH variation, the lower floating gate can be made of a material having a different property from a material of the upper floating gate and the STI etching process can be controlled, such that the lower floating gate can have different etching characteristics than the upper floating gate. As a result, the lower floating gate can have a smaller width than the upper floating gate after the etching process. Then, the deposited isolation layer 242, e.g., spin-on dielectric (SOD) material, can fill in a space between sidewalls of the lower floating gate and an inter-gate dielectric layer. As separation between a control gate layer and the lower floating gate is increased by the filled-in material of the isolation layer between the sidewalls of the lower gate and the dielectric layer, coupling between the floating gate and a control gate can be decreased. This decrease can reduce non-uniformity of GCR due to a variation of EFH in the recesses 243 between adjacent floating gates.

Referring to FIGS. 2M and 2N, an inter-gate dielectric layer 245 and a control gate layer 246 are formed, for example, sequentially, on the floating gates and in the recesses 243. The inter-gate dielectric layer 245 is configured to separate the floating gates 234 and the control gate layer 246. The inter-gate dielectric layer 245 can be an inter poly dielectric (IPD) layer and can be form by depositing OX/SiN/OX (ONO) film, SiN/OX/SiN/OX/SiN (NONON) film, or any other high-k (or high dielectric constant) dielectric film. The control gate layer 246 can be formed by depositing polysilicon with small grain sizes by furnace, e.g., for better filling into recesses 243' (or control gate (CG) plug). In some cases, a recess 247 is formed in the control gate layer 246 as a mark to separate the smaller cell pitch region 250 and the larger cell pitch region 260.

Referring to FIGS. 2O and 2P, MOS transistors are formed in the periphery MOS region 270 by forming a single gate in each of the MOS transistors. A photo resist layer 248 is formed on the control gate layer 246 and then part of the inter-gate electric layer 245 and the control gate layer 246 are removed in the periphery MOS region 270 to form openings 249. Then the photo resist layer 248 is removed and a conductive layer 252 is deposited on top of the control gate layer 246 and fills in the openings 249. Thus, the conductive layer 252 and the floating gate 234c are electrically connected to function as a single gate.

FIG. 2P shows a cross-sectional view of the formed non-volatile memory device 200 after the process steps, which is the same as the cross-section view of the non-volatile memory device 116 illustrated in FIG. 1D.

In some implementations, source/drain regions can be further formed in active regions 238 under respective floating gates 234 in the semiconductor substrate 202. Thus, floating gate transistors 254, 264 and MOS transistors 274 can be formed, respectively. The floating gate transistors 254 formed in the smaller cell pitch region 250 can function as memory cells with smaller cell pitches. The floating gate transistors 264 formed in the larger cell pitch region 260 can function as memory cells with larger cell pitches. The MOS transistors 274 formed in the periphery MOS region 270 have even larger CD than the floating gate transistors 254 and 264. Other components and periphery can be also formed on the semiconductor substrate 202 to form the non-volatile memory device 200.

Figure 3:
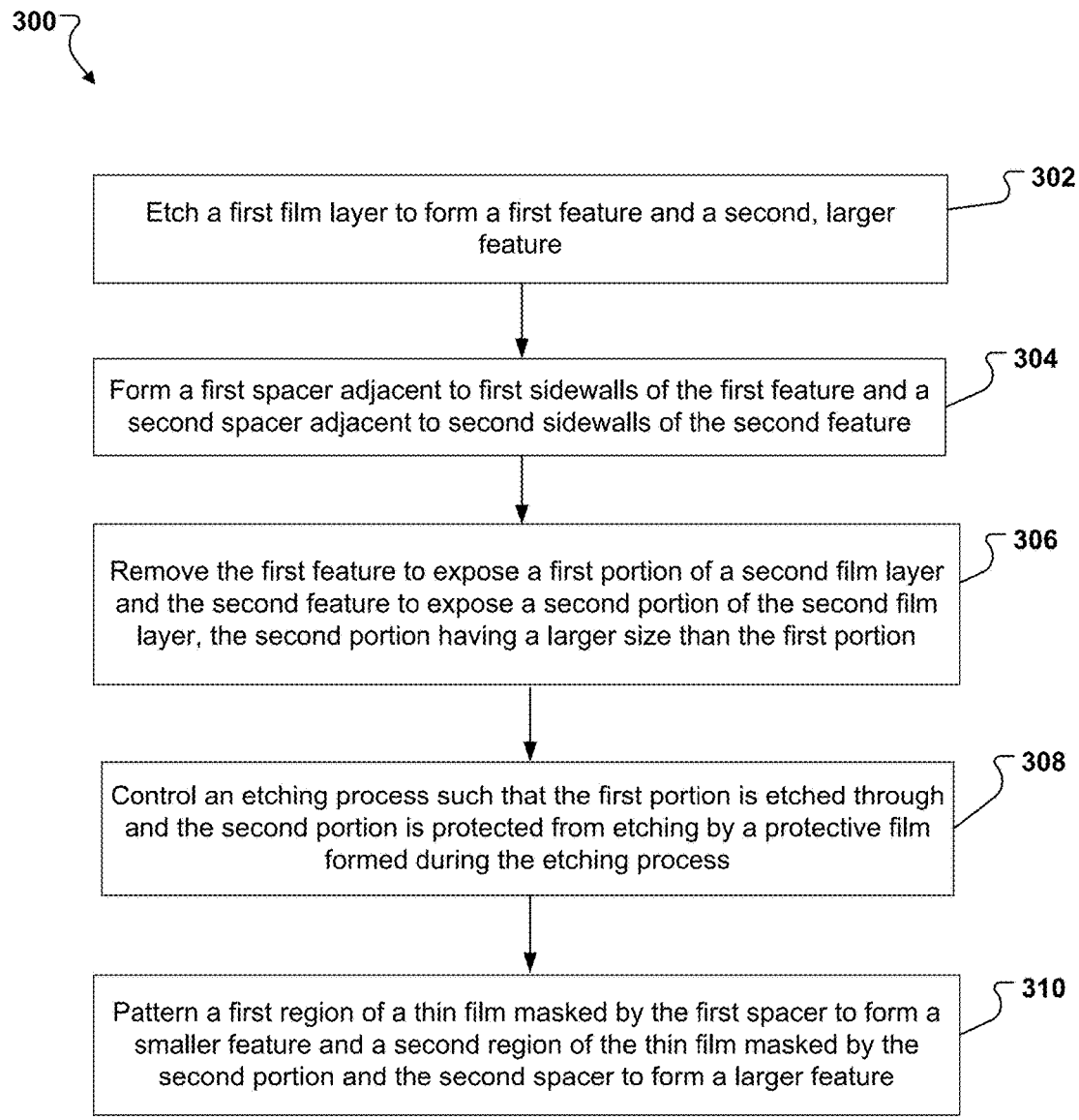
FIG. 3 shows an example process of patterning a thin film with different feature sizes, according to one or more implementations.

FIG. 3 shows an example process 300 of patterning a thin film with different feature sizes (or CDs). The thin film can be a target material layer, e.g., the floating gate layer 206 of FIG. 2A. The patterned thin film can be used for fabricating a semiconductor device, e.g., the non-volatile memory 116 of FIGS. 1A-1D or the non-volatile memory device 200 of FIG. 2P. The process 300 can include one or more process steps of the method shown in FIGS. 2A-2P.

A first film layer is etched with a patterned mask to form a first feature and a second feature (302). A second film layer is disposed below the first film layer, and the formed first feature and second feature are on the second film layer. The second feature has a larger critical dimension (CD) than the first feature. The CD can be a width. The first film layer is disposed below the patterned mask. The patterned mask can be a photo resist (PR) mask formed by lithographically patterning a photo resist layer disposed over the first film layer. The patterned mask includes respective PR features corresponding to the first feature and the second feature. In a particular example, the first film layer includes advanced patterning film (APF).

In some implementations, a template hard mask (HM) is deposited above the thin film. The template HM can include one or more HM layers sequentially disposed above the thin film. The first film layer can be a first HM layer in the template HM. The second film layer can be a second HM layer under the first HM layer in the template HM. In a particular example, the template HM includes an oxide layer, an amorphous silicon layer, a silicon nitride layer as the second film layer, and an advanced patterning film (APF) as the first film layer.

A first spacer adjacent to first sidewalls of the first feature and a second spacer adjacent to second sidewalls of the second feature are formed on the second film layer (304). In some implementations, forming the first spacer and the second spacer includes: conformally depositing a spacer layer over the first feature and the second feature and on the second film layer and etching the spacer layer to expose the first feature to form the first spacer and the second feature to form the second spacer. In a particular example, the spacer layer is a low temperature oxide (LTO) layer.

A CD of the first spacer, e.g., a width, can be identical to a thickness of the deposited spacer layer. A CD of the second spacer can be substantially same as the CD of the first spacer and identical to the thickness of the deposited spacer layer. The thickness of the deposited spacer layer can be in a range of approximately 10 nm to 36 nm.

The first feature is removed to expose a first portion of the second film layer and the second feature is removed to expose a second portion of the second film layer (306). The first portion is under the first feature and adjacent by the first spacer. Thus, the first portion has a CD corresponding to that of the first feature. Similarly, the second portion is under the second feature and adjacent by the second spacer. Thus, the second portion has a CD corresponding to that of the second feature. Since the second feature has a larger CD than the first feature, the second portion has a larger CD (and thus a larger surface area) than the first portion.

An etching process is controlled such that the first portion is etched through and the second portion is protected from etching by a protective film formed during the etching process (308). In the etching process, material of the second film layer is obtained and can react with an etching gas to generate polymer. When the generated polymer reaches a certain amount, it can form a polymer film on a surface of the second film layer to protect the second film layer from etching. As noted above, the second film layer can be made of material that can generate heavy polymer behavior to create a loading effect during an etching process. The material can include silicon nitride (SiN).

As the second portion has a larger surface area than the first portion, the second portion can provide more material to form the polymer. The etching process can be controlled, e.g., by controlling a flow rate of the etching gas, such that the amount of the generated polymer in the second portion is large enough to form a protective film to protect from etching while the amount of the generate polymer in the first portion is not large enough to form a protective film to protect from etching.

In some cases, the second film layer masked by the first spacer, the first feature, the second spacer, and the second feature is etched. In such a way, material of the second film layer adjacent to the first portion is reduced to form more polymer.

The thin film is patterned with a first region masked by the first spacer to form a smaller feature in the first region and with a second region masked by the second portion and the second spacer to form a larger feature in the second region (310). Accordingly, the smaller feature has a first width determined by the width of the first spacer, e.g., identical to the thickness of the deposited spacer layer. The larger feature has a second width determined by a width of the second feature and a width of the second spacer. Thus, the first width is smaller than the second width. In such a way, the thin film is patterned with features having different widths.

In some implementations, the patterned thin film is used a patterned mask to pattern another material layer. In some implementations, the patterned thin film is included in a semiconductor device, e.g., a non-volatile memory device. The semiconductor device can include an integrated memory circuit.

In some examples, the first region of the thin film is in a memory cell region of the integrated memory circuit. The smaller feature defines a smaller cell line width. The second region is in a periphery region of the integrated memory circuit, and the larger feature defines a device width larger than the smaller cell line width.

In some examples, the first region and the second region are both in a memory cell region of the integrated memory circuit, and the smaller feature defines a smaller cell line width and the larger feature defines a larger cell line width. As noted above, the smaller cell line width is determined by a width of the first spacer (thus a thickness of a deposited spacer layer), and the larger cell line width is determined by a width of the second feature and a width of the second spacer (thus the thickness of the deposited spacer layer).

The thin film can be a floating gate layer, and etching the first and second regions can include etching through the floating gate layer into the semiconductor substrate to form first discrete floating gates with the smaller cell line width in the first region and second discrete floating gates with the larger cell line width in the second region.

In some implementations, the patterned mask includes first and second PR features corresponding to the first feature and the second feature in the first thin film layer and a third PR feature, the third PR feature being over a third region of the thin film, the third region being in a periphery region of the integrated memory circuit. The third PR feature can be transferred into the first film layer to form a third feature on a third portion of the second film layer. The third PR feature can have a larger CD than the first PR feature and/or the second PR feature, thus the third portion can have a larger surface area than the first portion and/or the second portion, and accordingly the third portion can be protected from etching by another protective film formed during the etching process. The third region of the thin film masked by the third portion of the second film layer and third sidewall spacers formed adjacent to the third feature can be etched to form a third larger feature in the third region. The third larger feature defines a third width larger than the smaller cell line width and/or the larger cell line width.

The process 300 can further include: forming an isolation layer on the floating gates and in trenches therebetween, and selectively forming a second photo resist layer on the third region of the thin film. The process can include etching the isolation layer on the first and second regions to form recesses between adjacent floating gates, the isolation layer on the third region being protected from etching with the second photo resist layer. The process can include removing the second photo resist layer from the third region, forming an inter-gate dielectric layer on the first, second, and third regions, and forming a control gate layer on the inter-gate dielectric layer. In such a way, floating gate transistors with the smaller cell line width can be formed in the first region and floating gate transistors with the larger cell line width can be formed in the second region.

The process 300 can further proceed to form MOS transistors in the third region by forming a third photo resist layer on the first, second, and third regions. The process can further include selectively etching through the third photo resist layer, the control gate layer and the inter-gate dielectric layer to floating gates on the third region to form respective openings. The process can further include removing the third photo resist layer, and forming a conductive layer on the third region to fill in the respective openings such that the conductive layer and the floating gates on the third region are conductively connected.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of patterning a thin film, the method comprising:
    etching a first film layer disposed below a patterned mask to form a first feature and a second feature on a second film layer disposed below the first film layer, the second feature having a larger critical dimension (CD) than the first feature;
    forming a first spacer adjacent to sidewalls of the first feature and a second spacer adjacent to sidewalls of the second feature on the second film layer;
    removing the first feature to expose a first portion of the second film layer and removing the second feature to expose a second portion of the second film layer, the second portion having a larger CD than the first portion;
    controlling an etching process such that the first portion of the second film layer is etched through and the second portion of the second film layer is protected from etching by a protective film formed during the etching process; and
    patterning a first region of the thin film masked by the first spacer to form a smaller feature in the first region and patterning a second region of the thin film masked by the second portion and the second spacer to form a larger feature in the second region.

2. The method of claim 1, wherein the smaller feature has a first width determined by a width of the first spacer, and the larger feature has a second width determined by a width of the second feature and a width of the second spacer, the first width being smaller than the second width.

3. The method of claim 1, wherein controlling the etching process comprises:
etching the second portion of the second film layer to obtain material of the second film layer with an amount enough to react with an etching gas of the etching process to form the protective film on a surface of the second portion of the second film.

4. The method of claim 3, wherein controlling the etching process comprises:
controlling a flow rate of the etching gas.

5. The method of claim 1, wherein forming the first spacer and the second spacer comprises:
conformally depositing a spacer layer over the first feature and the second feature and on the second film layer; and
etching the spacer layer to expose the first feature to form the first spacer and the second feature to form the second spacer.

6. The method of claim 5, wherein a width of the first spacer corresponds to a thickness of the deposited spacer layer.

7. The method of claim 1, further comprising:
etching the second film layer masked by the first spacer, the first feature, the second spacer, and the second feature.

8. The method of claim 1, further comprising:
lithographically patterning a photo resist (PR) layer disposed over the first film layer to form the patterned mask, the patterned mask including respective PR features corresponding to the first feature and the second feature.

9. A method of fabricating a semiconductor device, the method comprising:
depositing a template hard mask over a first region and a second region of a target material layer on a semiconductor substrate;
lithographically patterning a photo resist (PR) layer disposed over the template hard mask to form a patterned mask on the template hard mask;
etching a first film layer of the template hard mask with the patterned mask to form a first feature and a second feature in at least a portion of the first film layer, the second feature having a width larger than the first feature;
conformally depositing a spacer layer over the first feature and the second feature and on a second film layer of the template hard mask, the second film layer disposed below the first film layer;
etching the spacer layer to expose the first feature to form first sidewall spacers adjacent to first sidewalls of the first feature and the second feature to form second sidewall spacers adjacent to second sidewalls of the second feature;
removing the first feature to expose a first portion of the second film layer and the second feature to expose a second portion of the second film layer, the second portion having a larger surface area than the first portion;
controlling an etching process such that the first portion of the second film layer is etched through and the second portion of the second film layer is protected from etching by a protective film formed during the etching process; and
etching the first region of the target material layer masked by the first sidewall spacers to form a smaller feature in the first region and the second region of the target material layer masked by the second portion of the second film layer and the second sidewall spacers to form a larger feature in the second region.

10. The method of claim 9, wherein controlling the etching process comprises:
etching the second portion of the second film layer to obtain material of the second film layer with an amount enough to react with an etching gas of the etching process to form the protective film on a surface of the second portion of the second film.

11. The method of claim 9, further comprising forming an integrated memory circuit on the semiconductor substrate, the integrated memory circuit including a memory cell region,
wherein the first region and the second region are in the memory cell region, the smaller feature defining a smaller cell line width and the larger feature defining a larger cell line width.

12. The method of claim 11, wherein the target material layer comprises a floating gate layer, and
wherein etching the first and second regions of the target material layer comprises etching through the floating gate layer into the semiconductor substrate to form first discrete floating gates with the smaller cell line width in the first region and second discrete floating gates with the larger cell line width in the second region.

13. The method of claim 11, wherein the smaller cell line width is determined by a width of the first sidewall spacers, and the larger cell line width is determined by a width of the second feature and a width of the second sidewall spacers.

14. The method of claim 11, wherein the patterned mask comprises first and second PR features corresponding to the first feature and the second feature in the first thin film layer and a third PR feature, the third PR feature being over a third region of the target material layer, the third region being in a periphery region of the integrated memory circuit.

15. The method of claim 14, wherein the third PR feature is transferred into the first film layer to form a third feature on a third portion of the second film layer, the third portion having a larger surface area than the first portion,
wherein the third portion is protected from etching by a second protective film formed during the etching process, and
wherein the method further comprises: etching the third region of the target material layer masked by the third portion of the second film layer and third sidewall spacers formed adjacent to the third feature to form a third larger feature in the third region, the third larger feature defining a third width larger than the larger cell line width.

16. The method of claim 15, further comprising:
forming an isolation layer on the floating gates and in trenches therebetween;
selectively forming a second photo resist layer on the third region of the conductive layer;
etching the isolation layer on the first and second regions to form recesses between adjacent floating gates, the isolation layer on the third region being protected from etching with the second photo resist layer;
removing the second photo resist layer from the third region;
forming an inter-gate dielectric layer on the first, second, and third regions; and forming a control gate layer on the inter-gate dielectric layer.

17. The method of claim 16, further comprising:

forming a third photo resist layer on the first, second, and third regions;

selectively etching through the third photo resist layer, the control gate layer and the inter-gate dielectric layer to floating gates on the third region to form respective openings;

removing the third photo resist layer; and forming a conductive layer on the third region to fill in the respective openings such that the conductive layer and the floating gates on the third region are conductively connected.

18. The method of claim 9, further comprising fabricating an integrated memory circuit on the semiconductor substrate, the integrated memory circuit including a memory cell region and a periphery region, wherein the first region is in the memory cell region, the smaller feature defining a smaller cell line width, and wherein the second region is in the periphery region, the larger feature defining a width larger than the smaller cell line width.

\* \* \* \* \*